United States Patent
Xu et al.

(10) Patent No.: US 10,032,678 B2
(45) Date of Patent: Jul. 24, 2018

(54) NANOWIRE CHANNEL STRUCTURES OF CONTINUOUSLY STACKED NANOWIRES FOR COMPLEMENTARY METAL OXIDE SEMICONDUCTOR (CMOS) DEVICES

(71) Applicant: QUALCOMM Incorporated, San Diego, CA (US)

(72) Inventors: Jeffrey Junhao Xu, San Diego, CA (US); Stanley Seungchul Song, San Diego, CA (US); Da Yang, San Diego, CA (US); Vladimir Machkaoutsan, Wezemaal (BE); Mustafa Badaroglu, Kessel-Lo (BE); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/198,763

(22) Filed: Jun. 30, 2016

(65) Prior Publication Data

US 2017/0110374 A1  Apr. 20, 2017

Related U.S. Application Data

(60) Provisional application No. 62/242,170, filed on Oct. 15, 2015.

(51) Int. Cl.
*H01L 27/092* (2006.01)
*H01L 21/8238* (2006.01)
(Continued)

(52) U.S. Cl.
CPC .... *H01L 21/823821* (2013.01); *H01L 21/022* (2013.01); *H01L 21/02118* (2013.01);
(Continued)

(58) Field of Classification Search
CPC ....... H01L 21/82343; H01L 21/823807; H01L 21/823821; H01L 27/0924; H01L 29/0673;
(Continued)

(56) References Cited

U.S. PATENT DOCUMENTS 8,298,881 B2   10/2012   Sleight et al.
8,330,143 B2   12/2012   Wernersson et al.
(Continued)

FOREIGN PATENT DOCUMENTS

WO     2015000205 A1     1/2015

OTHER PUBLICATIONS

International Search Report and Written Opinion for PCT/US2016/052039, dated Dec. 2, 2016, 13 pages.
(Continued)

*Primary Examiner* — Caridad Everhart
(74) *Attorney, Agent, or Firm* — Withrow & Terranova

(57) ABSTRACT

Nanowire channel structures of continuously stacked nanowires for complementary metal oxide semiconductor (CMOS) devices are disclosed. In one aspect, an exemplary CMOS device includes a nanowire channel structure that includes a plurality of continuously stacked nanowires. Vertically adjacent nanowires are connected at narrow top and bottom end portions of each nanowire. Thus, the nanowire channel structure comprises a plurality of narrow portions that are narrower than a corresponding plurality of central portions. A wrap-around gate material is disposed around the nanowire channel structure, including the plurality of narrow portions, without entirely wrapping around any nanowire therein. The exemplary CMOS device provides, for example, a larger effective channel width and better gate control than a conventional fin field-effect transistor (FET) (FinFET) of a similar footprint. The exemplary
(Continued)

CMOS device further provides, for example, a shorter nanowire channel structure than a conventional nanowire FET.

29 Claims, 22 Drawing Sheets

(51) Int. Cl.
    *H01L 21/02* (2006.01)
    *H01L 29/66* (2006.01)
    *H01L 29/78* (2006.01)
    *H01L 29/06* (2006.01)
    *H01L 29/04* (2006.01)
    *H01L 21/8234* (2006.01)

(52) U.S. Cl.
    CPC ........ *H01L 21/823431* (2013.01); *H01L 21/823807* (2013.01); *H01L 27/0924* (2013.01); *H01L 29/045* (2013.01); *H01L 29/0649* (2013.01); *H01L 29/0665* (2013.01); *H01L 29/0673* (2013.01); *H01L 29/66545* (2013.01); *H01L 29/66795* (2013.01); *H01L 29/7853* (2013.01)

(58) Field of Classification Search
    CPC ......... H01L 29/66795; H01L 29/045; H01L 29/66545; H01L 27/0092; H01L 27/00924; H01L 21/8238; H01L 29/0649; H01L 29/0669; H01L 29/7853; H01L 29/823431
    See application file for complete search history.

(56) References Cited

U.S. PATENT DOCUMENTS

| | | | |
|---|---|---|---|
| 8,415,209 | B2 | 4/2013 | Rooyackers et al. |
| 8,835,231 | B2 | 9/2014 | Bangsaruntip et al. |
| 9,029,835 | B2 | 5/2015 | Chu-King et al. |
| 9,123,567 | B2 | 9/2015 | Radosavljevic et al. |
| 9,184,301 | B2 | 11/2015 | Bangsaruntip et al. |
| 2007/0045748 | A1 | 3/2007 | Booth, Jr. et al. |
| 2007/0231997 | A1 | 10/2007 | Doyle et al. |
| 2008/0135949 | A1 | 6/2008 | Lo et al. |
| 2010/0187503 | A1 | 7/2010 | Moriyama et al. |
| 2010/0248454 | A1 | 9/2010 | Maszara et al. |
| 2012/0220093 | A1 | 8/2012 | Zhou et al. |
| 2013/0075797 | A1 | 3/2013 | Okano |
| 2013/0200433 | A1 | 8/2013 | Adam et al. |
| 2013/0234215 | A1 | 9/2013 | Okano |
| 2013/0313513 | A1* | 11/2013 | Cappellani ........ H01L 21/02587 257/9 |
| 2014/0034905 | A1 | 2/2014 | Bangsaruntip et al. |
| 2015/0097216 | A1* | 4/2015 | Chen .............. H01L 29/045 257/255 |
| 2015/0129934 | A1 | 5/2015 | Xie et al. |
| 2015/0137235 | A1 | 5/2015 | Liu et al. |
| 2015/0228480 | A1 | 8/2015 | Yin et al. |
| 2015/0228668 | A1* | 8/2015 | Ponoth ............ H01L 21/76224 257/350 |
| 2015/0236051 | A1 | 8/2015 | Loubet et al. |
| 2015/0372081 | A1 | 12/2015 | Lee et al. |
| 2016/0056236 | A1* | 2/2016 | Ching ............. H01L 21/823821 257/29 |
| 2016/0233317 | A1* | 8/2016 | Yin ................ H01L 29/66439 |
| 2016/0268375 | A1* | 9/2016 | Chen .............. H01L 29/0673 |
| 2017/0104062 | A1 | 4/2017 | Bi et al. |
| 2017/0110541 | A1* | 4/2017 | Xu ................. H01L 29/0673 |
| 2017/0170268 | A1 | 6/2017 | Song et al. |

OTHER PUBLICATIONS

Lee, Ming-Chang M. et al., "Thermal Annealing in Hydrogen for 3-D Profile Transformation on Silicon-on-Insulator and Sidewall Roughness Reduction," Journal of Microelectromechanical Systems, vol. 15, No. 2, Apr. 2006, IEEE, pp. 338-343.

Invitation to Restrict or Pay Additional Fees, and, Where Applicable, Protest Fee for PCT/US2016/052039, dated Sep. 14, 2017, 2 pages.

Second Written Opinion for PCT/US2016/052039, dated Nov. 6, 2017, 11 pages.

International Preliminary Report on Patentability for PCT/US2016/052039, dated Jan. 29, 2018, 30 pages.

\* cited by examiner

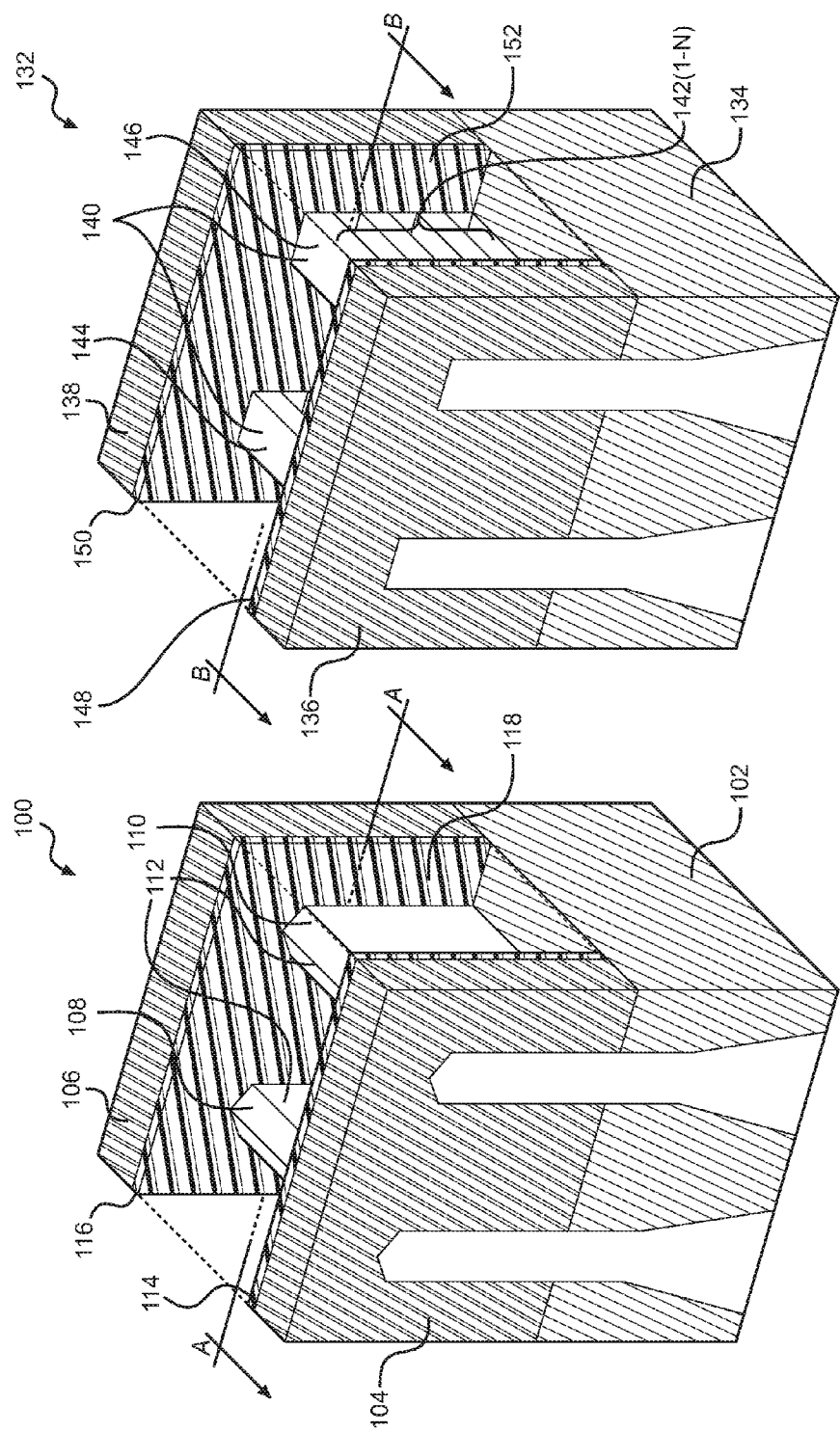

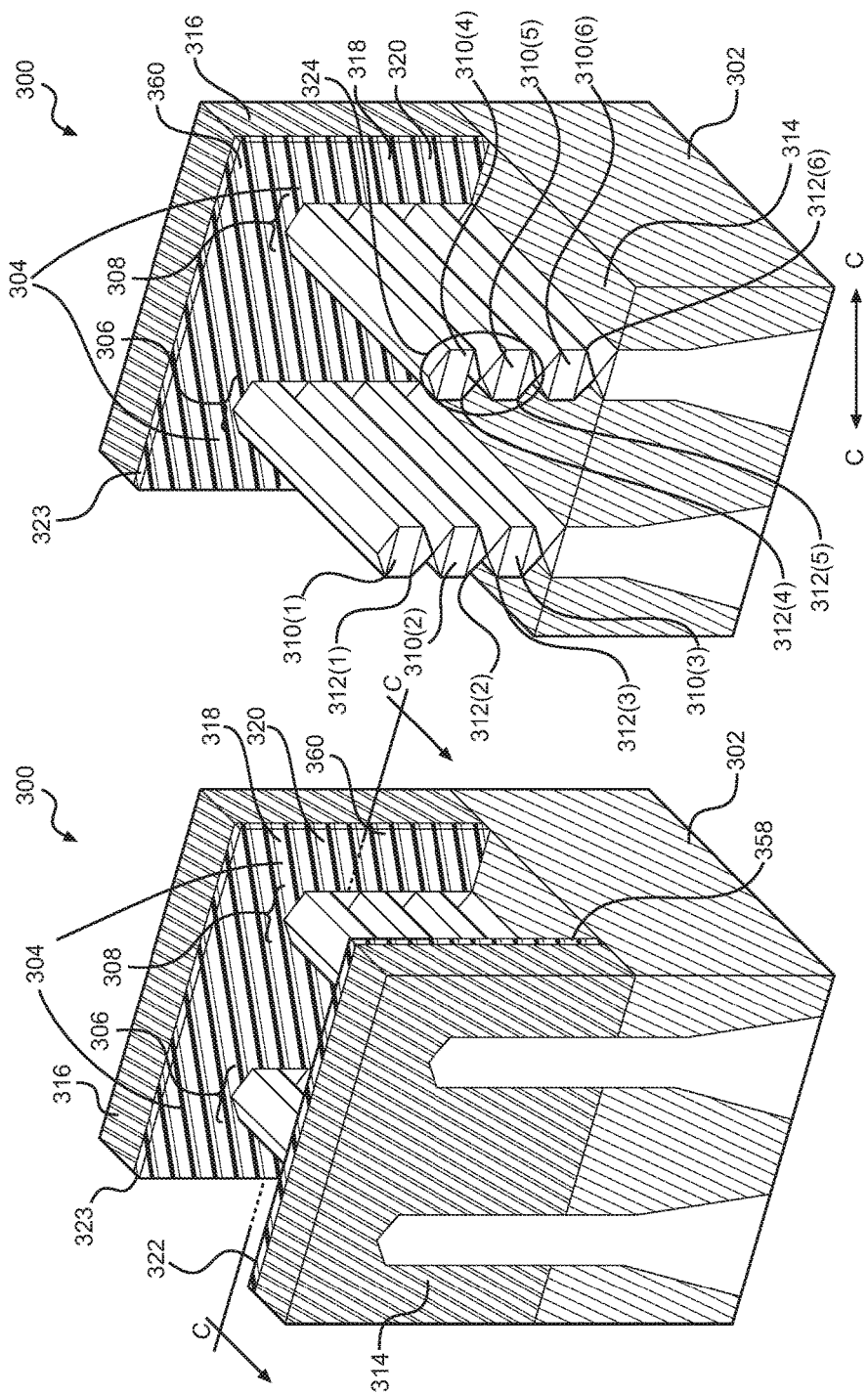

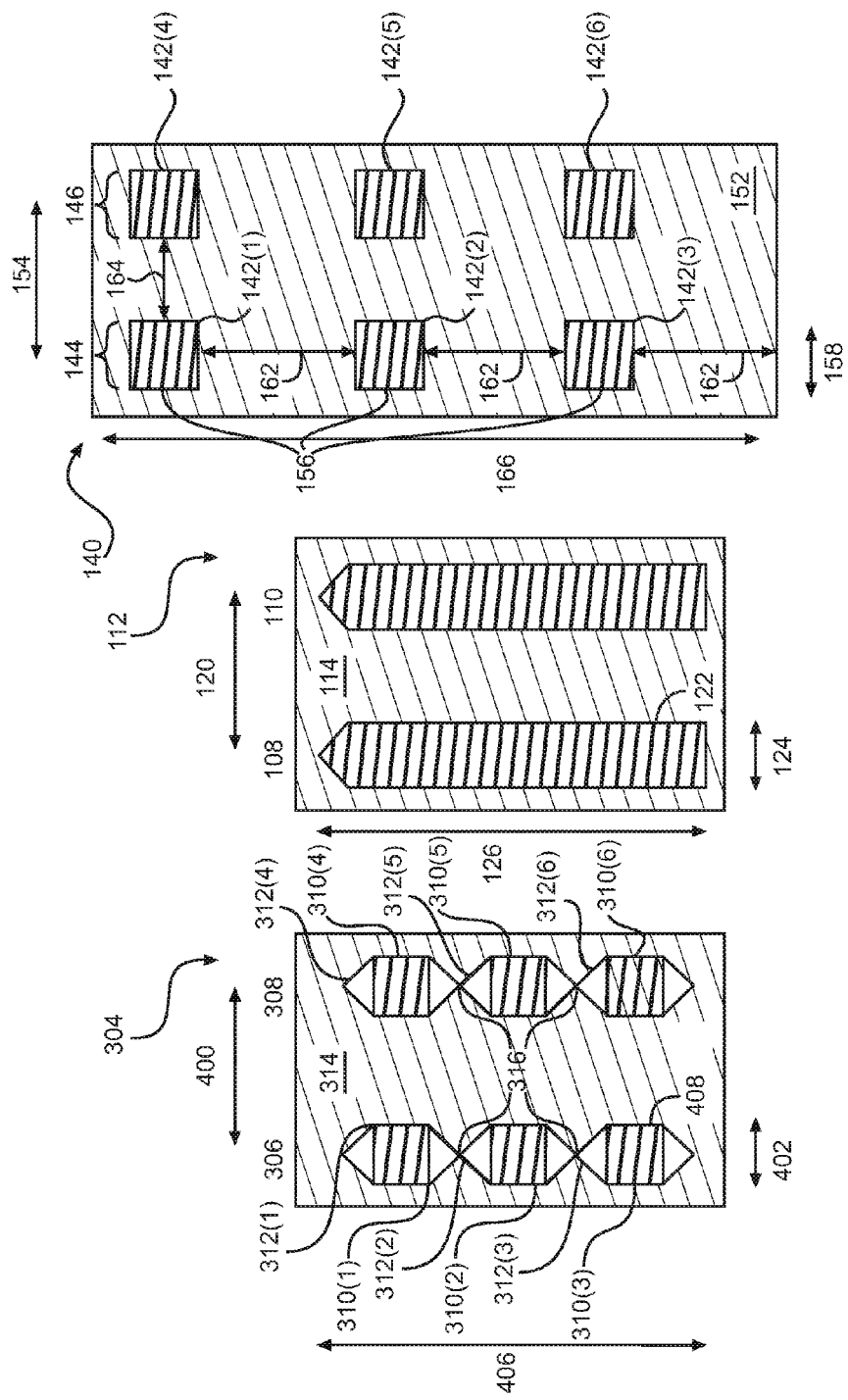

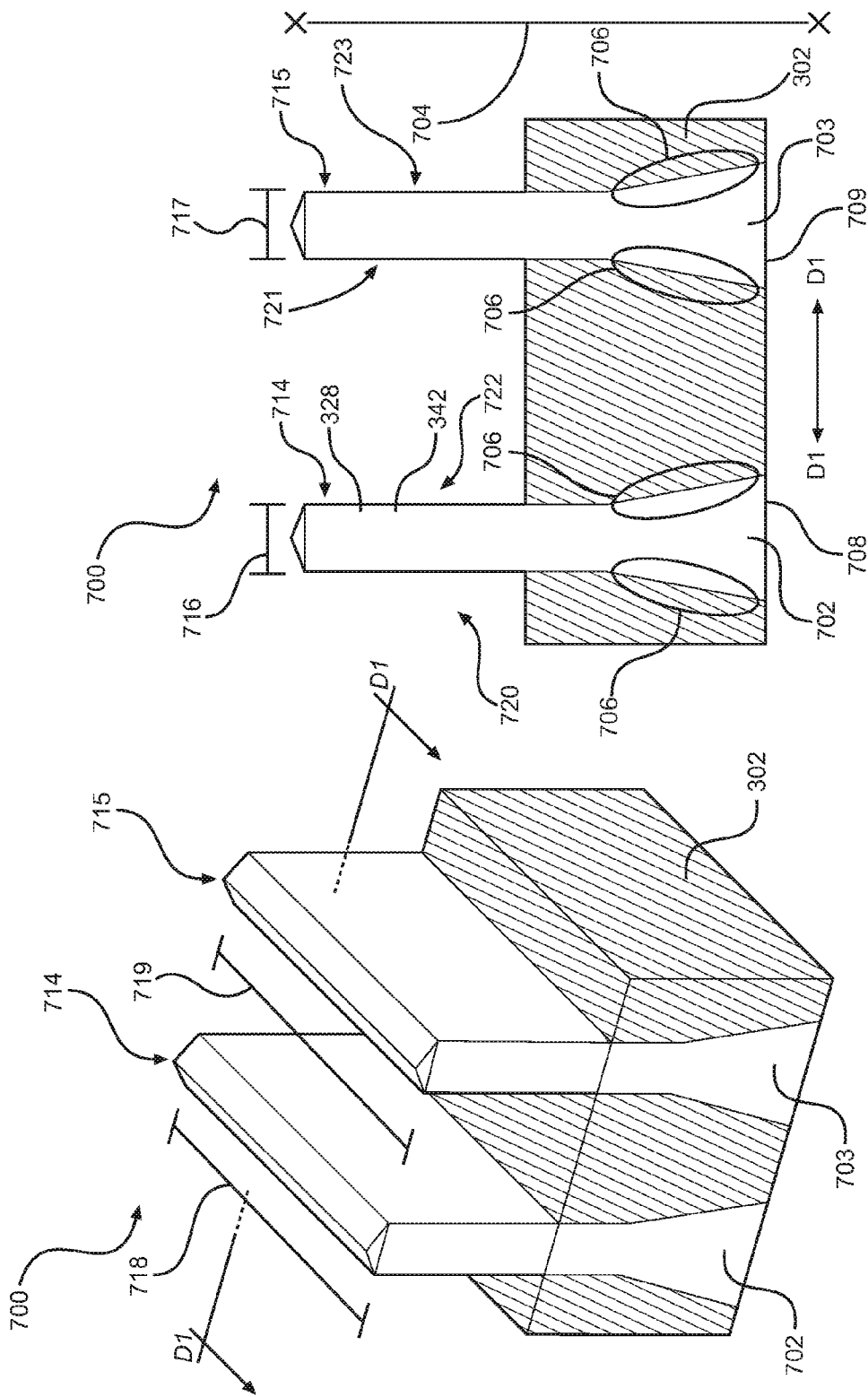

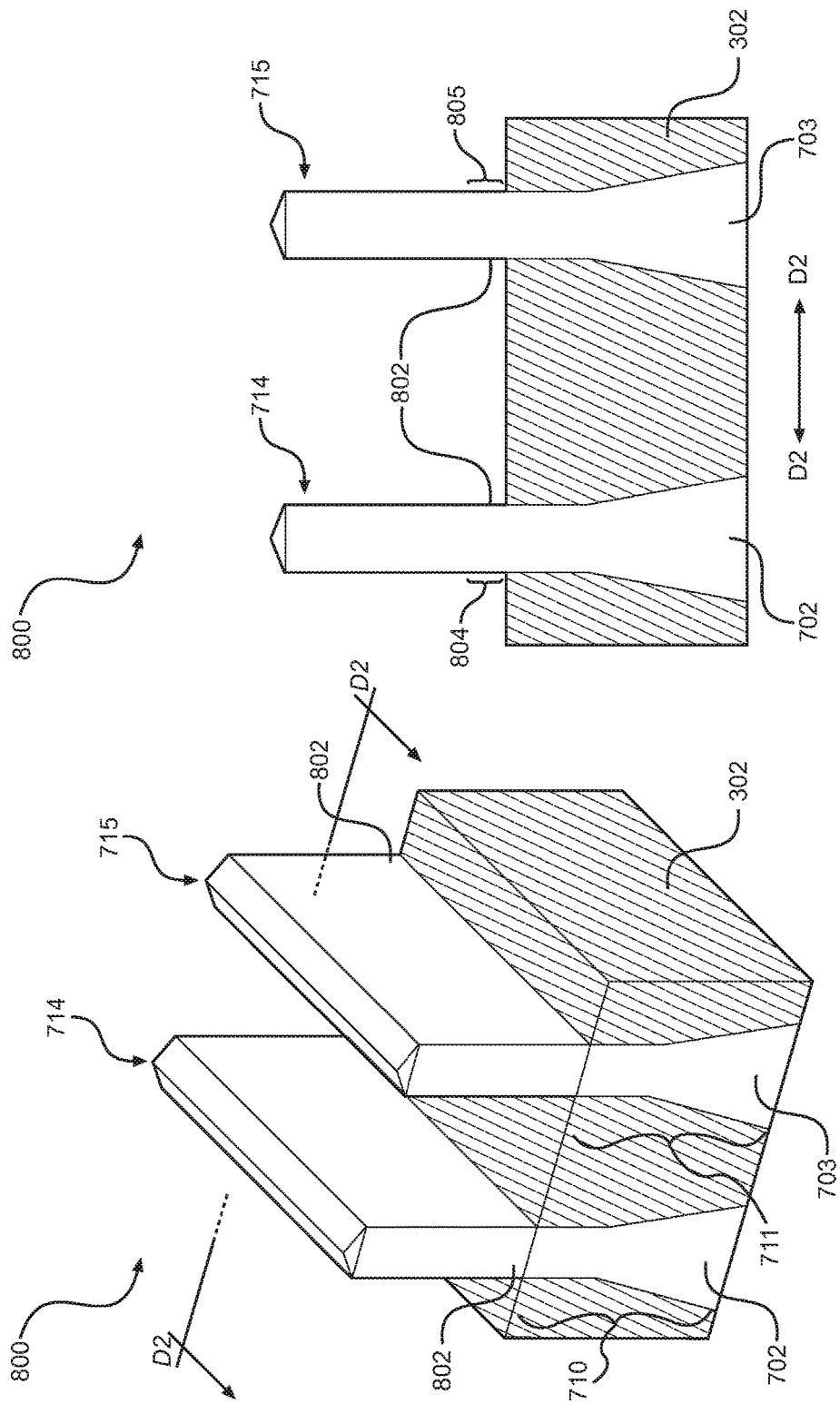

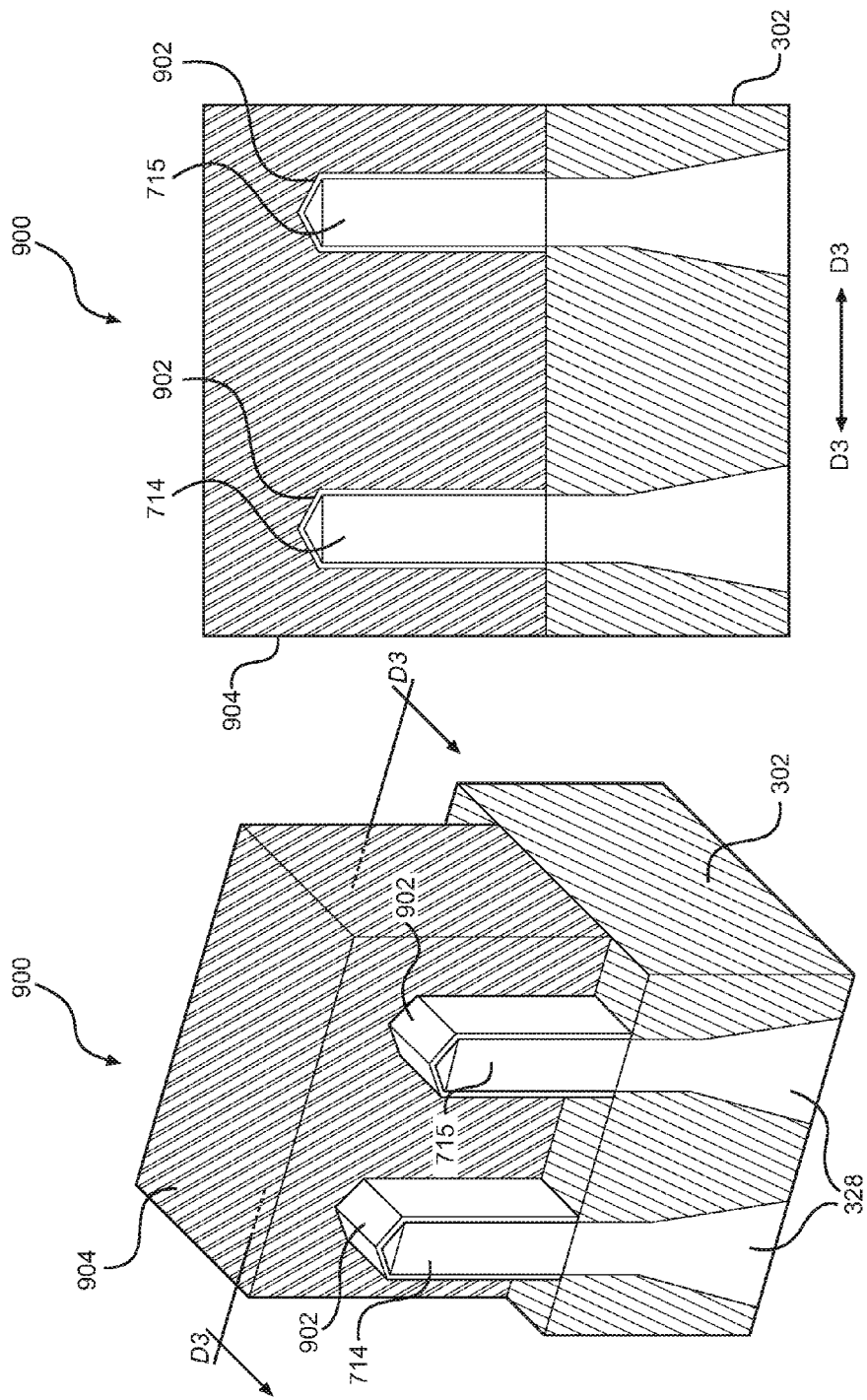

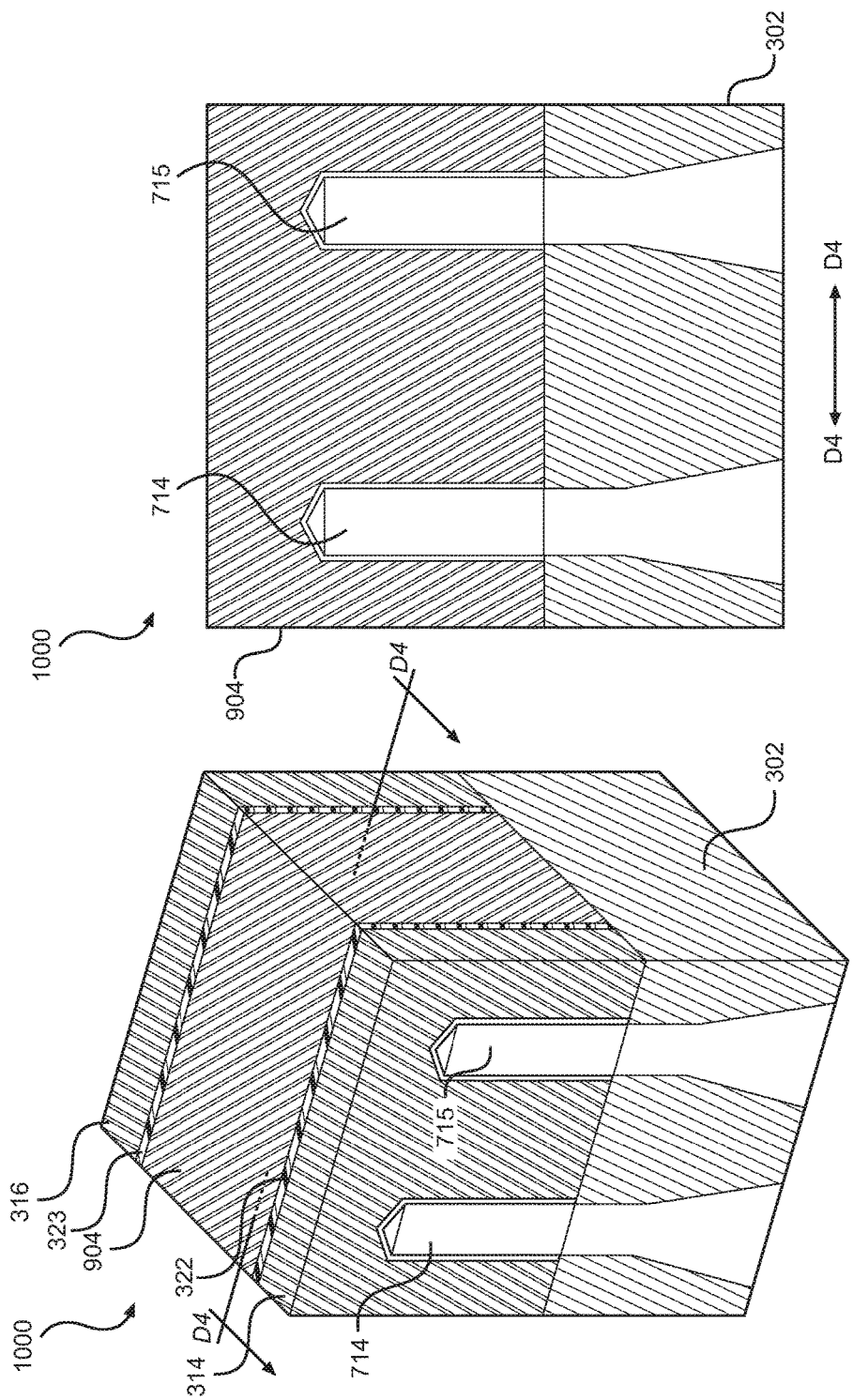

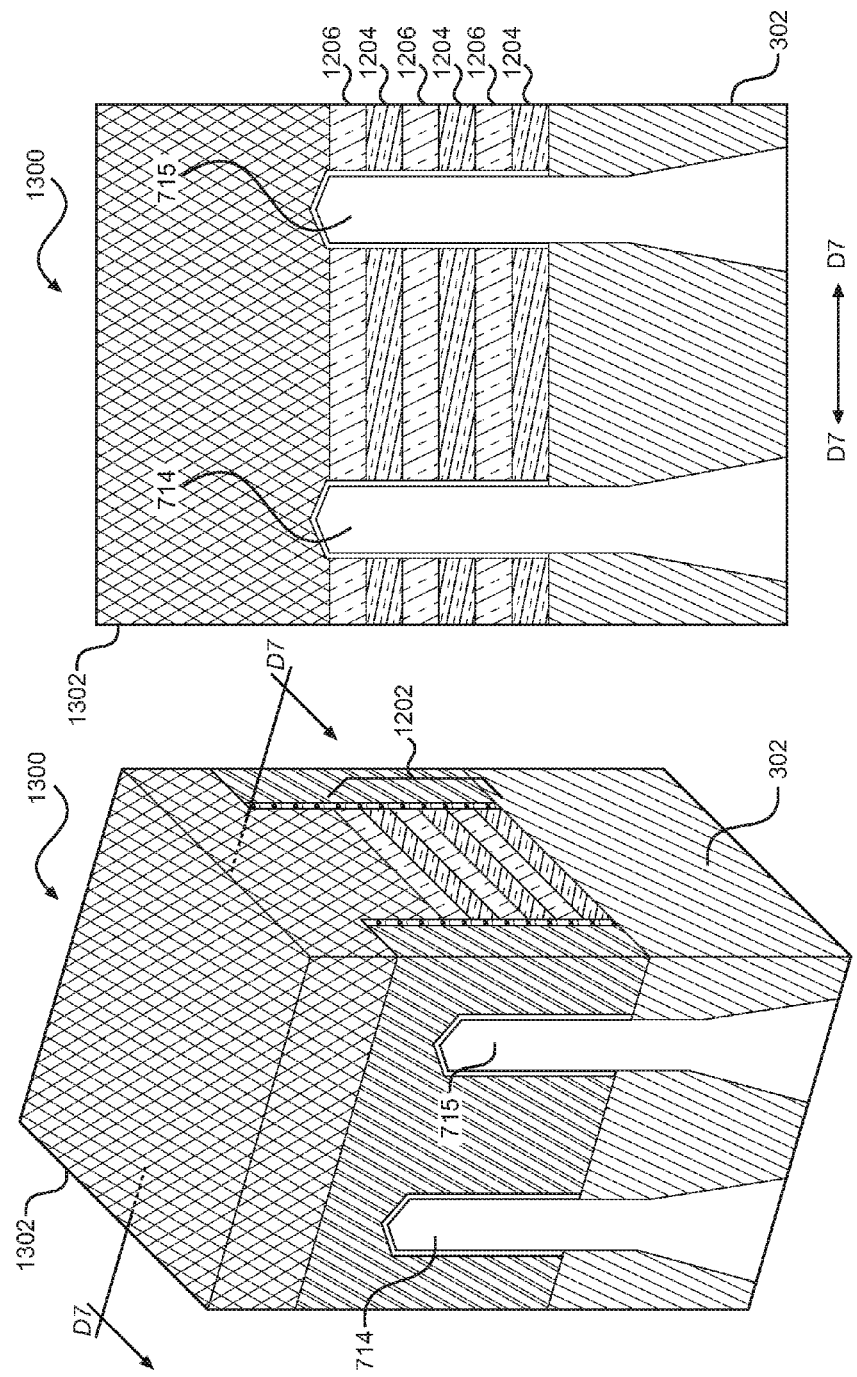

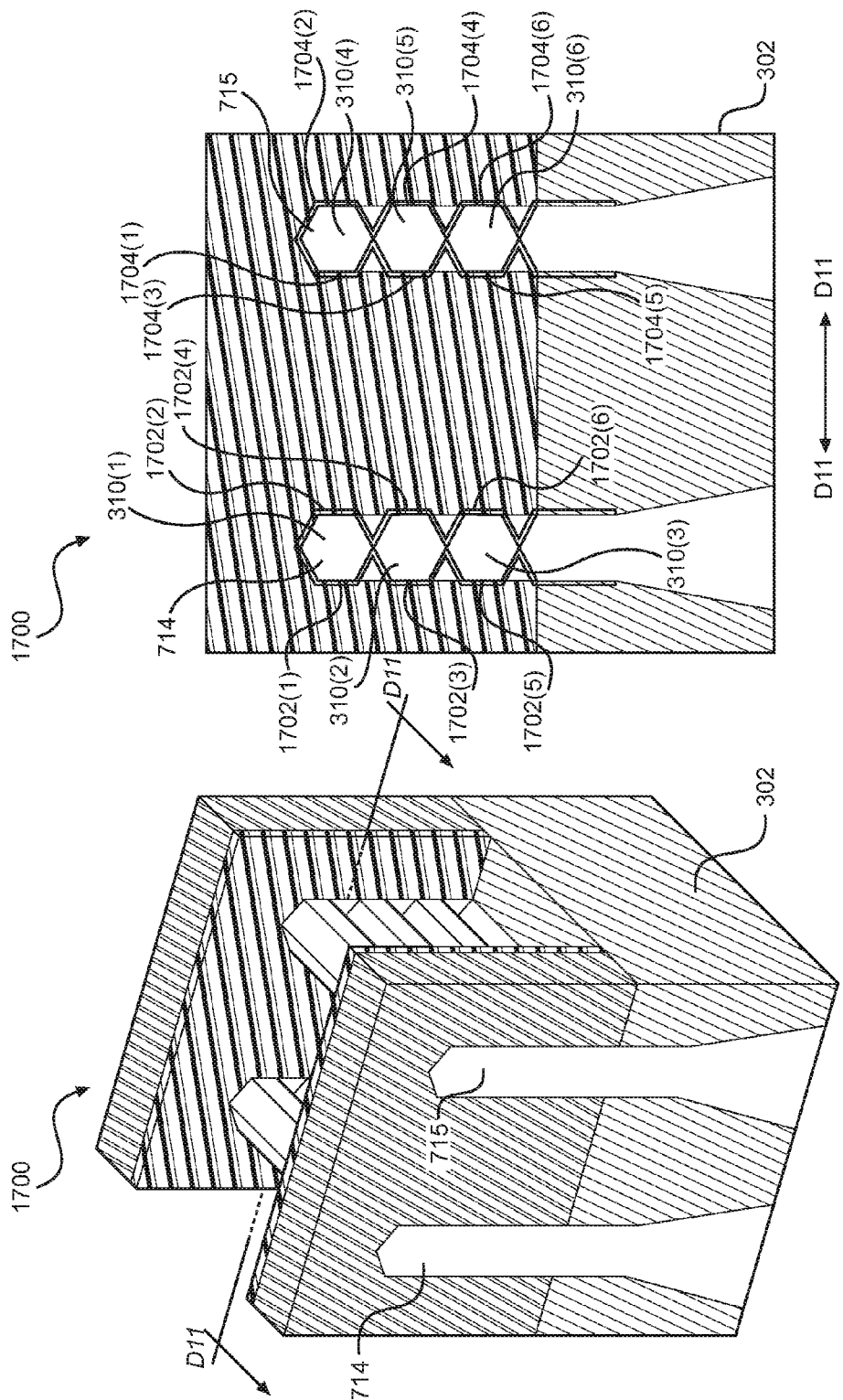

NANOWIRE CHANNEL STRUCTURES OF CONTINUOUSLY STACKED NANOWIRES FOR COMPLEMENTARY METAL OXIDE SEMICONDUCTOR (CMOS) DEVICES

PRIORITY CLAIM

The present application claims priority under 35 U.S.C. § 119(e) to U.S. Provisional Patent Application Ser. No. 62/242,170 filed on Oct. 15, 2015 and entitled "CONTINUOUSLY STACKED NANOWIRE STRUCTURES FOR COMPLEMENTARY METAL OXIDE SEMICONDUCTOR (CMOS) DEVICES," the contents of which is incorporated herein by reference in its entirety.

RELATED APPLICATION

The present application is related to U.S. patent application Ser. No. 15/198,892 filed on Jun. 30, 2016 and entitled "NANOWIRE CHANNEL STRUCTURES OF CONTINUOUSLY STACKED HETEROGENEOUS NANOWIRES FOR COMPLEMENTARY METAL OXIDE SEMICONDUCTOR (CMOS) DEVICES," the contents of which is incorporated herein by reference in its entirety.

BACKGROUND

I. Field of the Disclosure

This disclosure relates generally to complementary metal oxide semiconductor (CMOS) devices, and more specifically to implementing nanowire channel structures in CMOS devices.

II. Background

Transistors are essential components in modern electronic devices, and large numbers of transistors are employed in integrated circuits (ICs) therein. For example, components such as central processing units (CPUs) and memory systems each employ a large quantity of transistors for logic circuits and memory devices.

As electronic devices become more complex in functionality, so does the need to include a greater number of transistors in such devices. But as electronic devices are provided in increasingly smaller packages, such as in mobile devices for example, there is a need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length is of the same order of magnitude as the depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths), and therefore, reduced gate control.

In this regard, alternative transistor designs to planar transistors have been developed. These alternative transistor designs provide for a gate material to wrap around at least a portion of a channel structure to provide better gate control over an active channel therein. Better gate control provides reduced current leakage and increased threshold voltage compared to a planar transistor of a similar footprint. An example is a complementary metal oxide semiconductor (CMOS) fin field-effect transistor (FET) (FinFET). A FinFET provides a channel structure formed by a thin Silicon (Si) "fin," and a gate that wraps around top and side portions of the fin. FIG. 1A illustrates a conventional CMOS FinFET 100 ("FinFET 100") as an example. The FinFET 100 includes a substrate 102, a source 104, and a drain 106. The FinFET 100 further includes fin structures 108 and 110 disposed above the substrate 102 between the source 104 and the drain 106 to form a channel structure 112. The fin structures 108 and 110 are made of a conductive material, such as Silicon (Si) for example. The FinFET 100 further includes spacer layers 114 and 116 disposed to isolate the source 104 and the drain 106, respectively, from a "wrap-around" gate 118 disposed over the fin structures 108 and 110 in a later fabrication stage. Accordingly, the gate 118 wraps around top portions and side portions (not shown) of the fin structures 108 and 110.

FIG. 2A illustrates a cross section of the FinFET 100 across an A-A line illustrated in FIG. 1A. As shown in FIG. 2A, the fin structures 108 and 110 are disposed at a lateral pitch 120 which allows the gate 118 to wrap around the top portions and the side portions of the fin structures 108 and 110. The gate 118 does not wrap under the fin structures 108 and 110. This configuration provides an effective channel width of the FinFET 100, i.e., the area of the channel structure 112 that can be controlled by an electrostatic field generated when a voltage is applied to the gate 118, that is proportional to a perimeter 122 of the fin structure 108 exposed to the gate 118. This perimeter 122 is based on a width 124 of the fin structure 108 and a height 126 of the fin structure 108. Having the gate 118 wrap around the top portions and the side portions of the fin structures 108 and 110 allows for a larger effective channel width in comparison to a planar transistor of a similar footprint. Having a larger effective channel width provides better gate control over the channel structure 112, which makes the FinFET 100 less susceptible to performance degradation due to SCEs in comparison to a planar transistor of a similar footprint. Accordingly, having better gate control over the channel structure 112 allows for a further scaling down of the FinFET 100 relative to a planar transistor of a similar footprint.

However, additional scaling down of the FinFET 100 is subject to fabrication and performance limitations. For example, a reduction of the channel length of the FinFET 100 can increase sub-threshold leakage, negatively affect gate control, and negatively affect frequency performance of a circuit employing the FinFET 100. In this regard, another example of an alternative transistor design is a conventional CMOS nanowire device. In a conventional CMOS nanowire device, a nanowire channel structure is formed by a plurality of nanowires, such as Silicon (Si) nanowires for example. A "wrap-around" gate wraps completely around each nanowire of the plurality of nanowires. FIG. 1B illustrates a conventional CMOS nanowire device 132 ("nanowire device 132") as compared to the FinFET 100 in FIG. 1A. The nanowire device 132 includes a substrate 134, a source 136, and a drain 138. The nanowire device 132 further includes a nanowire channel structure 140. The nanowire channel structure 140 comprises nanowires 142(1-N) disposed above the substrate 134 and interposed between the source 136 and the drain 138. The nanowires 142(1-N) are configured in two (2) channel structure columns labeled 144 and 146. The nanowires 142(1-N) are made of a semiconductor material, such as Silicon (Si) for example. The nanowire device 132 further includes spacer layers 148 and 150 disposed to isolate the source 136 and the drain 138, respectively, from a gate 152 disposed over the nanowires 142(1-N) in a later fabrication stage. Accordingly, the gate 152 wraps entirely around each of the nanowires 142(1-N) of the nanowire channel structure 140.

FIG. 2B illustrates a cross section of the nanowire device 132 across a B-B line illustrated in FIG. 1B. As shown in FIG. 2B, the nanowire channel structure 140 comprises the nanowires 142(1-N), with N being 6 in this example. The channel structure columns 144 and 146 are disposed at a pitch 154, which allows the gate 152 to entirely wrap around each of the nanowires 142(1-N) of the nanowire channel structure 140. This configuration provides an effective channel width that is proportional to a perimeter 156 of the nanowires 142(1-3) of the channel structure column 144 exposed to the gate 152. In this example, the nanowires 142(1-3) are of a similar width 158 and of a similar height 160 (labeled only for the nanowire 142(3)). This configuration may allow for a larger effective channel width in comparison to a FinFET transistor of a similar footprint. For example, a larger effective channel width can be provided by the nanowire device 132 by increasing the number of nanowires 142(1-N). Accordingly, a large number of nanowires 142(1-N) may provide better gate control and increased drive strength in the nanowire device 132 that the FinFET 100.

However, fabrication and performance limitations may limit the number of nanowires 142(1-N) that can be disposed in the nanowire device 132, and therefore, limit the effective channel width therein. In particular, as shown in FIG. 2B, vertically adjacent nanowires, such as nanowires 142(1) and 142(2), are separated by a distance 162, while horizontally adjacent nanowires, such as nanowires 142(1) and 142(4), are separated by a distance 164. Thus, minimizing the distances 162 and 164 may allow for the formation of additional nanowires 142(1-N) in the nanowire device 132. Furthermore, minimizing the distances 162 and 164 may reduce the area between the gate 152 and the source 136, which may reduce parallel plate parasitic capacitance therein. In particular, the gate 152 and the source 136 are separated by the spacer layer 148, thus creating a parasitic parallel plate capacitance between the gate 152 and the source 136. Reducing the area between the gate 152 and the source 136 reduces the parasitic parallel plate capacitance between the gate 152 and the source 136, thus reducing a delay of the nanowire device 132. Reducing this delay increases the frequency performance of a circuit (not shown) that employs the nanowire device 132.

However, minimizing the distances 162 and 164 may not be possible or may provide drawbacks. In particular, the distances 162 and 164 are provided to allow the gate material for the gate 152 to be disposed completely around and between the nanowires 142(1-N), for example. Accordingly, minimizing the distances 162 and 164 is limited by at least the process of disposing the gate material for the gate 152. Furthermore, adjacent nanowires 142(1-N) of the nanowires 142(1-N) are separated by, for example, a gate material, which generates channel parasitic capacitance. This channel parasitic capacitance increases as adjacent nanowires 142(1-N) of the nanowires 142(1-N) are set closer together, thus increasing power consumption and overall performance.

Another way to add nanowires 142(1-N) to the nanowire device 132 is by increasing a height 166 of the nanowire channel structure 140 while maintaining required minimum distances for the distances 162 and 164. This may allow more nanowires 142(1-N) in the nanowire channel structure 140. However, performance and fabrication limitations may limit the height 166 of the nanowire channel structure 140. For example, increasing the height 166 of the nanowire channel structure 140 increases parasitic parallel plate capacitance between the gate 152 and the source 136 which, as explained earlier, may increase delay of the nanowire device 132, shift the threshold voltage of the nanowire device 132, and decrease frequency performance of a circuit (not shown) employing the nanowire device 132. Furthermore, increasing the height 166 of the nanowire channel structure 140 results in a high height-to-width aspect ratio for the nanowire channel structure 140. Having a high height-to-width aspect ratio in the nanowire channel structure 140 may be undesirable for forming the nanowire channel structure 140, in particular, and the nanowire device 132, generally, and may limit scaling down the nanowire device 132. Furthermore, having additional nanowires 142 (1-N) increases channel parasitic capacitance by providing additional nanowire-gate material-nanowire combinations. Therefore, performance and fabrication limitations regarding, for example, the distances 162 and 164, and the height 166, may limit further scaling down of the nanowire device 132.

SUMMARY OF THE DISCLOSURE

Aspects disclosed in the detailed description include nanowire channel structures of continuously stacked nanowires for complementary metal oxide semiconductor (CMOS) devices. A nanowire channel structure in a conventional nanowire device includes a plurality of nanowires, each nanowire completely surrounded by a gate material of a corresponding gate. This provides strong gate control and drive strength for a given footprint. However, further scaling down of the conventional nanowire device is limited by a height of a nanowire channel structure therein. In particular, scaling down of the nanowire device includes decreasing channel length, which results in increased leakage current and decreased gate control. To mitigate these effects of a decreased channel length, gate control over the corresponding nanowire channel structure may be improved by increasing the number of nanowires in the nanowire channel structure. However, in a conventional nanowire device, a minimum distance between nanowires must be provided to allow depositing of a gate material therein. Accordingly, increasing the number of nanowires results in an increase in the height of the nanowire channel structure. However, increasing the height of the nanowire channel structure may not be possible due to fabrication limitations associated with forming tall semiconductor structures and etching/forming nanowires therein. Furthermore, even when possible, increasing the height of the nanowire channel structure may not be desirable. For example, an increase in the nanowire channel structure height results in an increase in an area between the gate and the source/drain elements of the nanowire device, which in turn increases a parallel plate parasitic capacitance between the parallel gate and source/drain elements. This parallel plate parasitic capacitance may increase signal delay and negatively affect a frequency performance of a circuit employing the nanowire channel structure. Accordingly, an increase in the number of nanowires to increase gate control to mitigate adverse effects of scaling down the nanowire device may not be possible or desirable.

In this regard, to provide a nanowire device with strong gate control but with a channel structure providing minimal fabrication and performance limitations, nanowire channel structures comprising continuously stacked nanowires for CMOS devices are provided. In particular, an exemplary nanowire CMOS device ("nanowire device") includes a nanowire channel structure that includes a plurality of continuously stacked nanowires. Each of the plurality of continuously stacked nanowires is shaped to have a greater width at a central portion than at top and bottom end portions therein. Having continuously stacked nanowire structures eliminates the need to have a separation distance between vertically adjacent nanowires, thus providing a higher number of nanowires than a conventional nanowire device for a particular nanowire structure height. The greater number of nanowires provides increased gate control compared to the conventional nanowire device, but on a shorter nanowire channel structure, thus maintaining a lower parallel plate parasitic capacitance. Furthermore, the shorter nanowire channel structure simplifies fabrication compared to the conventional nanowire device.

Having the nanowires of the exemplary nanowire channel structure be continuously stacked reduces the number of adjacent nanowires separated by the gate material in the nanowire channel structure, thus substantially reducing channel parasitic capacitance therein. Further still, having continuously stacked nanowire structures allows a gate material of a gate therein to be disposed within trenches formed in separation areas formed by the narrower top and bottom end portions between the continuously stacked nanowires. Thus, the effective channel width, and therefore the gate control, provided by the exemplary nanowire device is comparable to that provided by a taller conventional nanowire device.

In this regard in one aspect, a CMOS device is provided. The CMOS device comprises a substrate, a source disposed on the substrate, a drain disposed on the substrate, and a channel body interposed between the source and the drain. The channel body comprises a channel comprising a nanowire channel structure. The nanowire channel structure comprises a plurality of nanowires arranged in a continuously stacked arrangement. Each of the plurality of nanowires comprises a top end portion, a bottom end portion, and a central portion disposed between the top end portion and the bottom end portion, the central portion comprising a greater width than the top end portion and the bottom end portion. The nanowire channel structure further comprises a plurality of separation areas, each disposed between central portions of vertically adjacent nanowires among the plurality of nanowires, and each formed by the bottom end portion of a higher nanowire of vertically adjacent nanowires and the top end portion of a lower nanowire of the vertically adjacent nanowires. The channel body further comprises a dielectric material layer disposed adjacent to the plurality of nanowires and extending into the plurality of separation areas disposed between the central portions of the adjacent nanowires among the plurality of nanowires. The channel body further comprises a gate material disposed adjacent to the dielectric material layer and extending into the plurality of separation areas disposed between the central portions of the vertically adjacent nanowires among the plurality of nanowires.

In another aspect, a method of fabricating a CMOS device is provided. The method comprises providing a semiconductor die for a CMOS device comprising a source formed on a substrate, a drain formed on a substrate, and a fin structure comprising a width and a length, the fin structure interposed lengthwise between the source and the drain, and comprising a first lateral side and a second lateral side. The method further comprises disposing a plurality of block co-polymer layers on the substrate adjacent to the fin structure, each of the plurality of block co-polymer layers comprising one of a first material of a first etching sensitivity and a second material of a second etching sensitivity different from the first etching sensitivity. The plurality of block co-polymer layers are disposed in an alternating configuration between a block co-polymer layer of the first material and a block co-polymer layer of the second material. The method further comprises removing each block co-polymer layer of the first material to form a plurality of exposed portions of the fin structure and a plurality of masked portions of the fin structure, each masked portion of the plurality of masked portions being masked by a block co-polymer layer of the second material. The method further comprises etching a plurality of trenches in the fin structure in each of the plurality of exposed portions of the fin structure, along the length of the fin structure on one of the first lateral side and the second lateral side of the fin structure to form a plurality of continuously stacked nanowires separated by a plurality of separation areas. Each of the plurality of separation areas comprises a first trench of the plurality of trenches on the first lateral side and a second trench of the plurality of trenches on the second lateral side. The method further comprises removing each block co-polymer layer of the second material to expose a central portion of the plurality of continuously stacked nanowires.

In another aspect, a CMOS device is provided. The CMOS device comprises a means for providing a substrate, a means for forming a source disposed on the substrate, a means for forming a drain disposed on the substrate, and a means for forming a channel body interposed between the means for forming the source and the means for forming the drain. The channel body comprises a means for forming a channel comprising a nanowire channel structure comprising a plurality of nanowires arranged in a continuously stacked arrangement. Each of the plurality of nanowires comprises a top end portion, a bottom end portion, and a central portion disposed between the top end portion and the bottom end portion, the central portion comprising a greater width than the top end portion and the bottom end portion. The nanowire channel structure further comprises a plurality of separation areas, each disposed between central portions of vertically adjacent nanowires among the plurality of nanowires, and each formed by the bottom end portion of a higher nanowire of the vertically adjacent nanowires and the top end portion of a lower nanowire of the vertically adjacent nanowires. The channel body further comprises a means for forming a dielectric material layer disposed adjacent to the plurality of nanowires and extending into portions of the plurality of separation areas disposed between the central portions of the vertically adjacent nanowires among the plurality of nanowires. The channel body further comprises a means for forming a gate material disposed adjacent to the means for forming the dielectric material layer and extending into the portions of the plurality of separation areas disposed between the central portions of the vertically adjacent nanowires among the plurality of nanowires.

BRIEF DESCRIPTION OF THE FIGURES

FIG. 1A illustrates a conventional complementary metal oxide semiconductor (CMOS) fin field-effect transistor (FET) (FinFET);

FIG. 1B illustrates a conventional CMOS nanowire device;

FIG. 3A illustrates an exemplary nanowire device that includes an exemplary nanowire channel structure of continuously stacked nanowires configured to expose a larger area of a channel structure to a wrap-around gate in comparison to a conventional FinFET of similar dimensions, and provide a shorter channel structure in comparison to a conventional nanowire device;

FIG. 3B illustrates a cross section of the exemplary nanowire device illustrated in FIG. 3A across a C-C line;

FIG. 4A illustrates a cross section of the exemplary nanowire channel structure of the exemplary nanowire device illustrated in FIG. 3A across a C-C line that includes exemplary dimensions to illustrate an effective channel length;

FIGS. 4B and 4C illustrate, respectively, a cross section of a channel structure for the conventional CMOS FinFET illustrated in FIG. 1A and a cross section of the channel structure for the conventional nanowire device employing non-continuously stacked nanowire structures illustrated in FIG. 1B to illustrate their effective channel length as compared to the exemplary nanowire channel structure in FIG. 4A;

FIGS. 7A and 7B are profile and cross-sectional diagrams, respectively, of an exemplary fabrication process of forming semiconductor fins above a shallow trench isolation substrate for fabricating the exemplary nanowire device illustrated in FIGS. 3A and 3B;

FIGS. 8A and 8B are profile and cross-sectional diagrams, respectively, of an exemplary fabrication process of forming an isolation layer over a bottom portion of the fins, above the substrate, for fabricating the exemplary nanowire device illustrated in FIGS. 3A and 3B;

FIGS. 9A and 9B are profile and cross-sectional diagrams, respectively, of an exemplary fabrication process of disposing an oxide layer above the fins, and a poly mask/dummy gate above the substrate and above the fins for later formation of spacer layers, a drain, and a source for manufacturing the exemplary nanowire device illustrated in FIGS. 3A and 3B;

FIGS. 10A and 10B are profile and cross-sectional diagrams, respectively, of an exemplary fabrication process of disposing the spacer layers on the substrate adjacent to the poly mask/dummy gate, and disposing the source and the drain on the substrate adjacent to the spacer layers, respectively, for fabricating the exemplary nanowire device illustrated in FIGS. 3A and 3B;

FIGS. 13A and 13B are profile and cross-sectional diagrams, respectively, of an exemplary fabrication process of disposing a capping layer above the plurality of block co-polymer layers for fabricating the exemplary nanowire device illustrated in FIGS. 3A and 3B;

FIGS. 17A and 17B are profile and cross-sectional diagrams, respectively, of an exemplary fabrication process of removing each block co-polymer layer of the second material to expose a central portion of the plurality of nanowires and removing the capping layer for fabricating the exemplary nanowire device illustrated in FIGS. 3A and 3B;

DETAILED DESCRIPTION

Figure 2B:
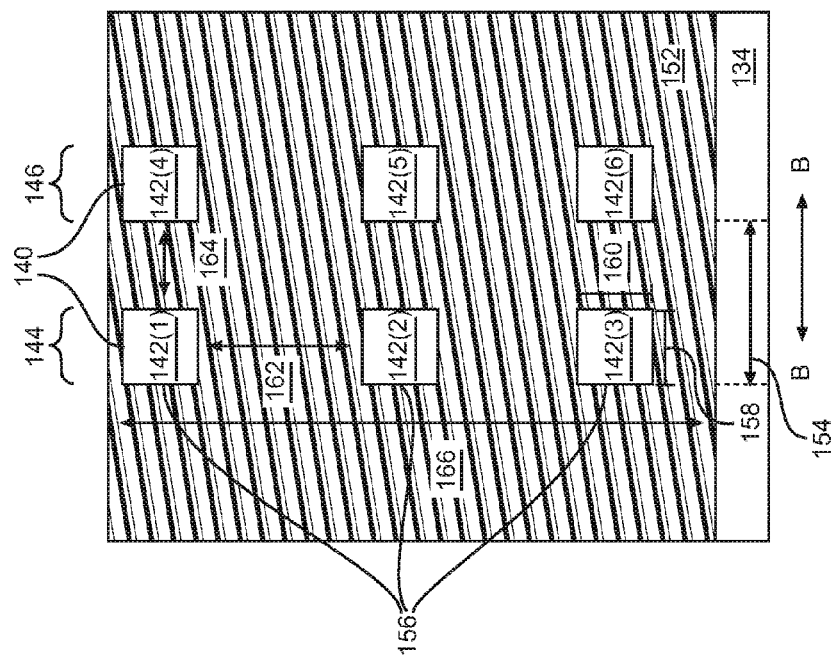
FIG. 2B illustrates a cross section of the conventional CMOS nanowire device illustrated in FIG. 1B across a B-B line.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include nanowire channel structures of continuously stacked nanowires for complementary metal oxide semiconductor (CMOS) devices. A nanowire channel structure in a conventional nanowire device includes a plurality of nanowires, each nanowire completely surrounded by a gate material of a corresponding gate. This provides strong gate control and drive strength for a given footprint. However, further scaling down of the conventional nanowire device is limited by a height of a nanowire channel structure therein. In particular, scaling down of the nanowire device includes decreasing channel length, which results in increased leakage current and decreased gate control. To mitigate these effects of a decreased channel length, gate control over the corresponding nanowire channel structure may be improved by increasing the number of nanowires in the nanowire channel structure. However, in a conventional nanowire device, a minimum distance between nanowires must be provided to allow depositing of a gate material therein. Accordingly, increasing the number of nanowires results in an increase in the height of the nanowire channel structure. However, increasing the height of the nanowire channel structure may not be possible due to fabrication limitations associated with forming tall semiconductor structures and etching/forming nanowires therein. Furthermore, even when possible, increasing the height of the nanowire channel structure may not be desirable. For example, an increase in the nanowire channel structure height results in an increase in an area between the gate and the source/drain elements of the nanowire device, which in turn increases a parallel plate parasitic capacitance between the parallel gate and source/drain elements. This parallel plate parasitic capacitance may increase signal delay and negatively affect a frequency performance of a circuit employing the nanowire channel structure. Accordingly, an increase in the number of nanowires to increase gate control to mitigate adverse effects of scaling down the nanowire device may not be possible or desirable.

In this regard, to provide a nanowire device with strong gate control but with a channel structure providing minimal fabrication and performance limitations, nanowire channel structures comprising continuously stacked nanowires for CMOS devices are provided. In particular, an exemplary nanowire CMOS device ("nanowire device") includes a nanowire channel structure that includes a plurality of continuously stacked nanowires. Each of the plurality of continuously stacked nanowires is shaped to have a greater width at a central portion than at top and bottom end portions therein. Having continuously stacked nanowire structures eliminates the need to have a separation distance between vertically adjacent nanowires, thus providing a higher number of nanowires than a conventional nanowire device for a particular nanowire structure height. The greater number of nanowires provides increased gate control compared to the conventional nanowire device, but on a shorter nanowire channel structure, thus maintaining a lower parallel plate parasitic capacitance. Furthermore, the shorter nanowire channel structure simplifies fabrication compared to the conventional nanowire device.

Having the nanowires of the exemplary nanowire channel structure be continuously stacked reduces the number of adjacent nanowires separated by the gate material in the nanowire channel structure, thus substantially reducing channel parasitic capacitance therein. Further still, having continuously stacked nanowire structures allows a gate material of a gate therein to be disposed within trenches formed in separation areas formed by the narrower top and bottom end portions between the continuously stacked nanowires. Thus, the effective channel width, and therefore the gate control, provided by the exemplary nanowire device is comparable to that provided by a taller conventional nanowire device.

In this regard, FIG. 3A illustrates an exemplary nanowire device that includes an exemplary nanowire channel structure of continuously stacked nanowires configured to expose a larger area of a channel structure to a wrap-around gate in comparison to a conventional FinFET of similar dimensions, and provide a shorter channel structure in comparison to a conventional nanowire device. FIG. 3B illustrates a cross section of the exemplary nanowire device 300 across a C-C line. The exemplary nanowire device 300 includes a substrate 302 and an exemplary nanowire channel 304 including exemplary nanowire channel structures 306 and 308 disposed on the substrate 302. The exemplary nanowire channel 304 only includes two (2) nanowire channel structures 306, 308. However, it is noted that the exemplary nanowire channel 304 may include more or fewer nanowire channel structures 306, 308 based on required drive current, size, or signal speed, for example. The exemplary nanowire channel 304 includes a plurality of nanowires 310(1-M), with M being 6 in this example, in a continuously stacked arrangement among the nanowire channel structures 306, 308. In this example, each of the nanowires 310(1-M) has a corresponding cross section 312(1-M) that has a substantially hexagonal cross section. The exemplary nanowire device 300 further includes a source 314 disposed on the substrate 302 and a drain 316 disposed on the substrate 302. As illustrated in FIG. 3A, the nanowire channel 304 is interposed between the source 314 and the drain 316. The exemplary nanowire device 300 further includes a gate 318 comprising a gate material 320 disposed on the substrate 302 around the plurality of nanowires 310(1-M). The exemplary nanowire device 300 further includes spacer layers 322 and 323 disposed to isolate the source 314 and the drain 316, respectively, from the gate 318.

Figure 3C:
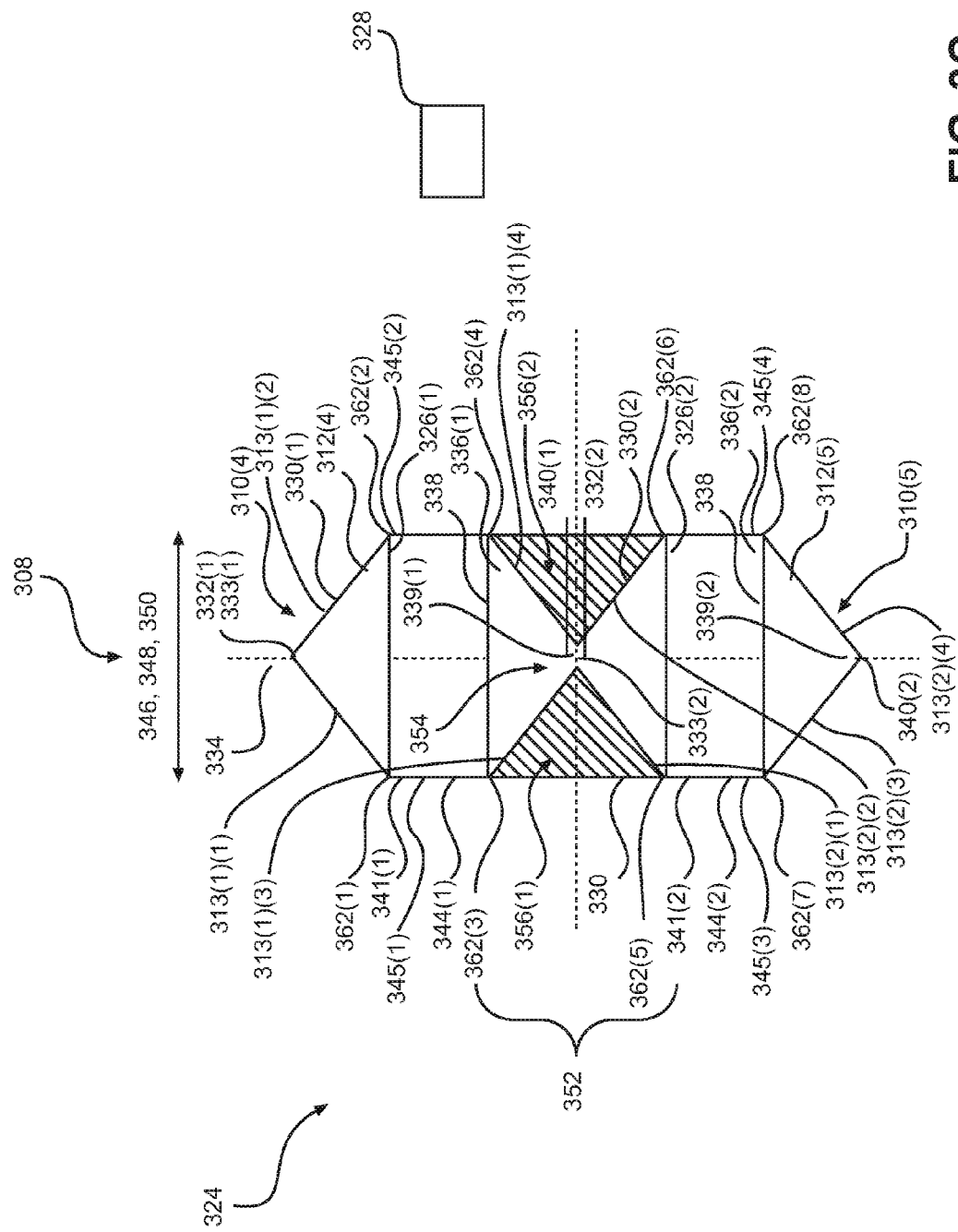
FIG. 3C illustrates an expanded section of a separation area of the exemplary nanowire channel structure illustrated in FIG. 3B.

FIG. 3C illustrates an expanded section 324 of the nanowire channel structure 308 of the exemplary nanowire device 300 illustrated in FIG. 3B to further describe elements of the nanowire channel structure 308. FIG. 3C illustrates vertically adjacent nanowires 310(4) and 310(5), which are arranged in a continuously stacked arrangement, having cross sections 312(4) and 312(5), respectively. The nanowires 310(4) and 310(5) are comprised of a material 328, such as a semiconductor material 328, such as Silicon (Si), Silicon Germanium (SiGe), or Germanium (Ge), for example. To provide a separation area between the vertically adjacent nanowires 310(4) and 310(5) in the nanowire channel structure 308, in this example, the vertically adjacent nanowires 310(4) and 310(5) include top end portions 326(1) and 326(2), respectively. The top end portions 326(1) and 326(2) have substantially triangular cross sections 330 (1) and 330(2), respectively. The triangular cross sections 330(1) and 330(2) are formed, in part, by body-centered cubic (BCC)<111> facet sidewalls 313(1)(1) and 313(1)(2), and 313(2)(1) and 313(2)(2), respectively. Furthermore, the top end portions 326(1) and 326(2) have top end points 332(1) and 332(2), respectively, formed by vertexes 333(1) and 333(2) of the substantially triangular cross sections 330(1) and 330(2), respectively, at substantially a horizontal center 334 of the nanowire channel structure 308.

Furthermore, each of the vertically adjacent nanowires 310(4) and 310(5) comprises bottom end portions 336(1) and 336(2) and has substantially triangular cross sections 338(1) and 338(2), respectively. The triangular cross sections 338(1) and 338(2) are formed, in part, by the BCC <111> facet sidewalls 313(1)(3) and 313(1)(4), and 313(2) (3) and 313(2)(4), respectively. Furthermore, the bottom end portions 336(1) and 336(2) have bottom end points 340(1) and 340(2) formed by vertexes 339(1) and 339(2) of the substantially triangular cross sections 338(1) and 338(2), respectively, at substantially the horizontal center 334 of the nanowire channel structure 308.

Furthermore, each of the vertically adjacent nanowires 310(4) and 310(5) comprises central portions 341(1) and 341(2), respectively. The central portion 341(1) is disposed between the top end portion 326(1) and the bottom end portion 336(1). The central portion 341(1) has a substantially rectangular cross section 344(1) having BCC <110> facet sidewalls 345(1) and 345(2), and a width 346 between the BCC <110> facet sidewalls 345(1) and 345(2) that is at least as large as the largest of a width 348 of the top end portion 326(1) and a width 350 of the bottom end portion 336(1). The central portion 341(2) is disposed between the top end portion 326(2) and the bottom end portion 336(2). The central portion 341(2) has a substantially rectangular cross section 344(2) having BCC <110> facet sidewalls 345(3) and 345(4), and a width 346 between the BCC <110> facet sidewalls 345(1) and 345(2) that is at least as large as the largest of a width 348 of the top end portion 326(2) and a width 350 of the bottom end portion 336(2). Thus, in this example, the cross sections 312(4) and 312(5) of the vertically adjacent nanowires 310(4) and 310(5) are substantially hexagonal cross sections formed by BCC <111> facet sidewalls and BCC <110> facet sidewalls. For example, the cross section 312(4) of the nanowire 310(4) is formed by the BCC <111> facet sidewalls 313(1)(1)-313(1)(4) and the BCC <110> facet sidewalls 345(1) and 345(2).

FIG. 3C further illustrates a separation area 352 between the vertically adjacent nanowires 310(4) and 310(5). The separation area 352 includes the bottom end portion 336(1) of the higher vertically adjacent nanowire 310(4) and the top end portion 326(2) of the lower vertically adjacent nanowire 310(5). The separation area 352 further includes a continuity area 354 in which the bottom end point 340(1) of the vertically adjacent nanowire 310(4) contacts the top end point 332(2) of the vertically adjacent nanowire 310(5), which is below the vertically adjacent nanowire 310(4). The separation area 352 further includes trenches 356(1) and 356(2) adjacent to each side of the continuity area 354 and between the vertically adjacent nanowires 310(4) and 310(5).

Accordingly, in the configuration of the exemplary nanowire device 300, and in particular of the nanowire channel structures 306 and 308, the gate material 320 of the gate 318 does not completely surround any of the vertically adjacent nanowires of the plurality of nanowires 310(1-M). However, when the gate material 320 is disposed over the nanowire channel structures 306, 308, the gate material 320 is disposed into corresponding trenches 356(1) and 356(2) of the separation area 352 between the vertically adjacent nanowires of the plurality of nanowires 310(1-M). Therefore, when the gate 318 generates an electrostatic field to activate the nanowire channel 304, substantially all of the perimeter of the vertically adjacent nanowires of the plurality of nanowires 310(1-M) is exposed to the electrostatic field. This allows for improved gate control compared to a fin channel structure of similar height and width (not shown), and gate control similar to that of a much taller conventional nanowire channel structure (not shown).

Furthermore, having the vertically adjacent nanowires of the plurality of nanowires 310(1-M) arranged in a continuously stacked arrangement eliminates the vertical separation distance 162 employed in the nanowire channel structure 140 in FIG. 2B. Specifically, because the gate material 320 of the gate 318 is not disposed completely around the vertically adjacent nanowires of the plurality of nanowires 310(1-M) in FIG. 3C, the vertical separation distance 162 employed in the nanowire channel structure 140 in FIG. 2B is not necessary. This allows for the nanowire channel structures 306, 308 to be shorter, which in turn allows for inclusion of a higher number of vertically adjacent nanowires of the plurality of nanowires 310(1-M) compared to the nanowire channel structure 140 illustrated in FIG. 2B. In addition, by being shorter, the nanowire channel structures 306, 308 provide for a lower parallel plate parasitic capacitance compared to the nanowire channel structure 140 illustrated in FIG. 2B. In particular, parallel plate parasitic capacitances are generated in a parallel plate area 358 between the gate 318 and the source 314, and in a parallel plate area 360 between the gate 318 and the drain 316 as shown in FIG. 3A. These parallel plate parasitic capacitances are proportional to the size of these parallel plate areas 358, 360. Accordingly, because the nanowire channel structures 306, 308 provide for parallel plate areas 358, 360 that are smaller than those provided by the nanowire channel structure 140 illustrated in FIG. 2B, the nanowire channel structures 306, 308 provide for smaller parallel plate parasitic capacitances as well. Therefore, the nanowire channel structures 306, 308 provide a smaller delay than the conventional nanowire device 132 illustrated in FIG. 1B.

Furthermore, as noted earlier, the shorter nanowire channel structures 306, 308 allow for a higher number of vertically adjacent nanowires of the plurality of nanowires 310(1-M) compared to the nanowire channel structure 140 illustrated in FIG. 2B. The higher number of vertically adjacent nanowires of the plurality of nanowires 310(1-M) provides additional area between the vertically adjacent nanowires of the plurality of nanowires 310(1-M) and the gate material 320 of the gate 318, thus improving gate control and allowing for a reduction in the channel length compared to the nanowire device 132 illustrated in FIG. 1B. Furthermore, having the vertically adjacent nanowires of the plurality of nanowires 310(1-M) continuously stacked provides for a significantly lower parasitic channel capacitance between the vertically adjacent nanowires in the nanowire channel 304 compared to the nanowire channel structure 140 illustrated in FIG. 1B. In particular, a parasitic channel capacitance is created between conducting nanowires, such as the vertically adjacent nanowires 310(4) and 310(5), separated by an isolating material, such as any oxide layers (not shown) isolating the vertically adjacent nanowires 310(4) and 310(5) from the gate material 320. By providing the continuity area 354 between the vertically adjacent nanowires of the plurality of nanowires 310(1-M), this parasitic channel capacitance is removed or significantly reduced in the nanowire channel 304 compared to the nanowire channel structure 140 illustrated in FIG. 1B.

Figure 2A:
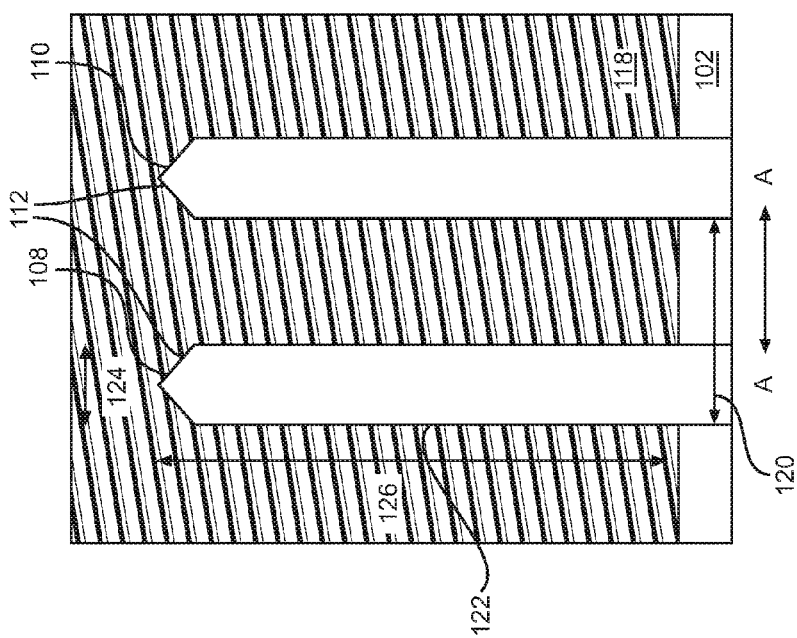
FIG. 2A illustrates a cross section of the conventional CMOS FinFET illustrated in FIG. 1A across an A-A line.
Figure 5:
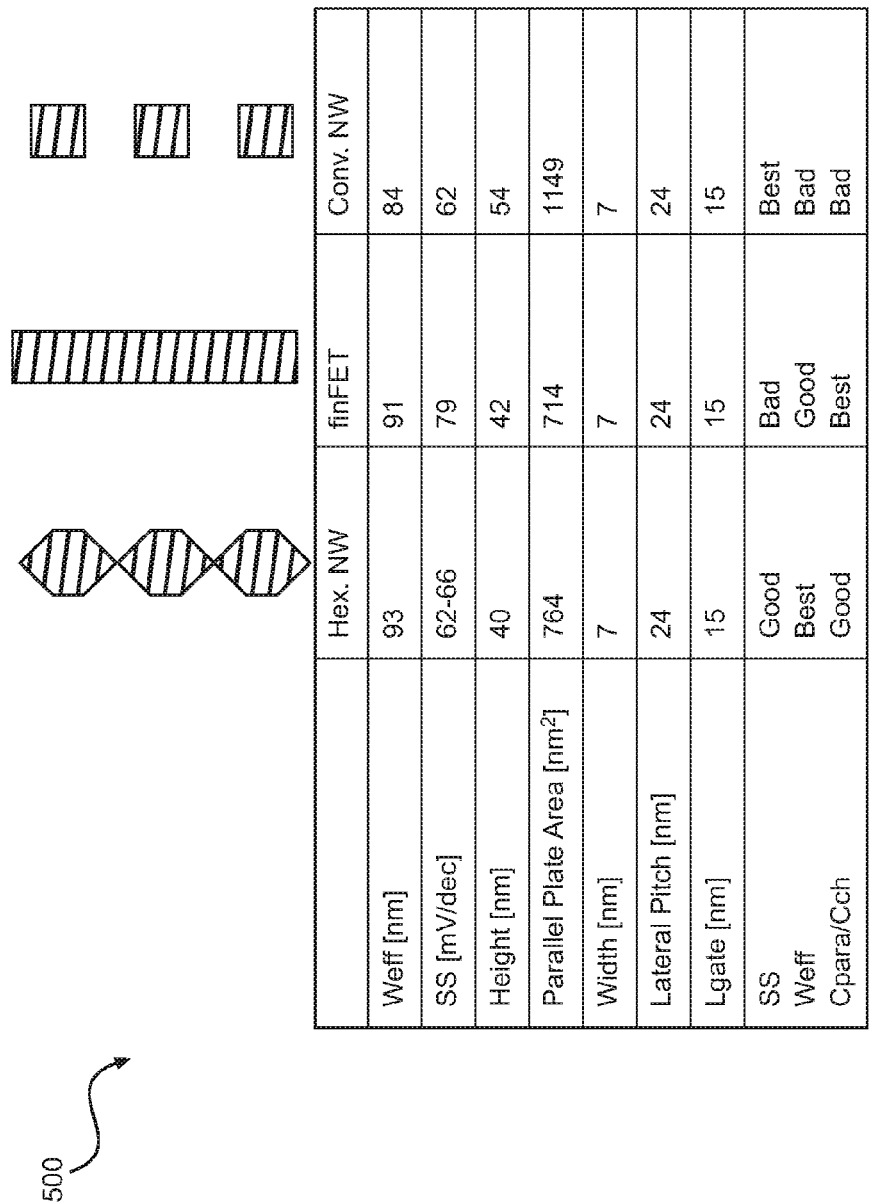
FIG. 5 is a table showing effective characteristics that effect the effective channel length of the exemplary nanowire device illustrated in FIG. 3A, the conventional FinFET device illustrated in FIG. 1A, and the conventional CMOS nanowire device illustrated in FIG. 1B, based on the dimensions provided in FIGS. 4A-4C for comparison purposes.

FIGS. 4A-4C and FIG. 5 are provided to illustrate and contrast features of the exemplary nanowire channel 304 in FIGS. 3A-3C, the channel structure 112 in FIGS. 1A and 2A, and the nanowire channel structure 140 in FIGS. 1B and 2B. In particular, FIG. 4A illustrates a cross section of the nanowire channel 304, including the nanowire channel structures 306, 308 of the exemplary nanowire device 300 across a C-C line illustrated in FIG. 3A. FIGS. 4B and 4C illustrate, respectively, a cross section of the channel structure 112 of the FinFET 100 illustrated in FIG. 1A across an A-A line, and a cross section of the nanowire channel structure 140 of the nanowire device 132 illustrated in FIG. 1B across a B-B line. FIGS. 4A-4C are provided to illustrate exemplary dimensions of the corresponding channel structures 306, 308, 112, and 140 for comparing their effective channel length, channel width, sub-threshold slope (SS), and parasitic parallel plate capacitance. FIG. 5, which will be discussed in conjunction with FIGS. 4A-4C, is a table 500 showing effective characteristics that effect the effective channel length of the nanowire device 300 illustrated in FIG. 3A, the FinFET 100 illustrated in FIG. 1A, and the nanowire device 132 illustrated in FIG. 1B, based on the dimensions provided in FIGS. 4A-4C. It is noted that, although the dimensions provided for comparison purposes do not provide the actual channel width, SS, and parasitic parallel plate capacitance therein, these dimensions provided herein with respect to FIGS. 4A-4C and 5 can be used to compare the channel structures regarding these characteristics. For example, because the parasitic parallel plate capacitance of a channel structure is proportional to the parallel plate area therein, i.e., the area between a gate and source/drain contacts therein, comparing the parallel plate area of the illustrated channel structures allows for a comparison of corresponding parasitic parallel plate capacitances. Similarly, because the effective channel width of a channel structure is proportional to its perimeter, i.e., the area of the channel structure exposed to the gate material therein, comparing perimeters of the illustrated channel structures allows for a comparison of corresponding effective channel widths.

Regarding FIG. 4A, the nanowire channel 304 provided therein comprises six (6) nanowires 310(1)-310(6) configured in two (2) nanowire channel structures 306 and 308, as an example. Each of the nanowire channel structures 306, 308 comprises three (3) continuously stacked nanowires 310(1)-310(3) and 310(4)-310(6), respectively, in this example. Furthermore, the continuously stacked nanowires 310(1)-310(6) are illustrated as having corresponding cross sections 312(1)-312(6), which are illustrated as substantially hexagonal cross sections with BCC <111> and BCC <110> facet sidewalls, as an example. In this example, the nanowire channel 304 has a lateral pitch 400, i.e., the pitch for a nanowire channel structure 306, 308 therein, of 24 nanometers (nm) (Lateral Pitch in FIG. 5). Furthermore, each of the nanowire channel structures 306, 308 has a width 402 of 7 nm (Width in FIG. 5). Further still, the nanowire channel structures 306, 308 have a height 406 of 40 nm (Height in FIG. 5). Further still, each of the nanowire channel structures 306, 308 has a perimeter 408 of 93 nm ((3×perimeter of a nanowire), or (3×~31 nm)) (Weff in FIG. 5). Based on these dimensions, a parallel plate area per column pitch of the nanowire channel 304, i.e., the area between the gate 318 and the source 314 and drain 316 illustrated in FIG. 3A, is 764 squared nm ((total area=24 nm×40 nm)–196 squared nm (column area)). In addition, based on a gate length of 15 nm, and the use of Silicon (Si) as gate material, the nanowire channel 304 provides a SS, i.e., a feature of a FET's current-voltage characteristic, of 62-66 mV/dec (lowest is best).

Regarding FIG. 4B, the channel structure 112 provided therein comprises two (2) fin structures 108 and 110. In this example, the channel structure 112 has a lateral pitch 120 of 24 nm (Lateral Pitch in FIG. 5). Furthermore, each of the fin structures 108 and 110 has a width 124 of 7 nm (Width in FIG. 5). Further still, the channel structure 112 has a height 126 of 42 nm (Height in FIG. 5). Further still, each of the fin structures 108 and 110 has a perimeter 122 of 91 nm (2×42 nm+7 nm) (Weff in FIG. 5). Based on the dimensions, a parallel plate area per lateral pitch of the channel structure 112, i.e., the area between the gate 118 and the source 104 and drain 106 illustrated in FIG. 1A, is 714 squared nm (24 nm×42 nm–294 squared nm (column area)). In addition, based on a gate length of 15 nm, and the use of Silicon (Si) as gate material, the channel structure 112 provides a sub-threshold slope of 79 mV/dec (lowest is best). Thus, as is illustrated in FIG. 5, the nanowire channel 304 provides a Weff similar to that of the channel structure 112 on a shorter channel structure and with a significantly lower SS (i.e., better gate control). However, due to a higher parallel plate area, the nanowire channel 304 provides a higher parallel plate capacitance.

Regarding FIG. 4C, the nanowire channel structure 140 comprises six (6) nanowires 142(1)-142(6) configured in two (2) channel structure columns labeled 144 and 146. Each of the channel structure columns 144 and 146 comprises three (3) nanowires 142(1)-142(3) and 142(4)-142(6), respectively, separated by a vertical separation distance 162. The vertical separation distance 162 can be, for example, 11 nm. The nanowire channel structure 140 has a lateral pitch 154 of 24 nm (Lateral Pitch in FIG. 5). Furthermore, each of the channel structure columns 144 and 146 has a width 158 of 7 nm (Width in FIG. 5). Further still, the nanowire channel structure 140 has a height 166 of 54 nm (Height in FIG. 5). Further still, each of the channel structure columns 144 and 146 has a perimeter 156 of 84 nm ((3×perimeter of a nanowire), or (3×~28 nm)) (Weff in FIG. 5). Based on the dimensions, a parallel plate area per column pitch of the nanowire channel structure 140, i.e., the area between the gate 152 and the source/drain elements 136, 138 illustrated in FIG. 1B, is 1149 squared nm ((total area=24 nm×66 nm)–147 squared nm (column area)). In addition, based on a gate length of 15 nm, and the use of Silicon (Si) as gate material, the nanowire channel structure 140 provides a SS, i.e., a feature of a FET's current-voltage characteristic, of 62 mV/dec (lowest is best). Thus, as is illustrated in FIG. 5, the nanowire channel 304 provides a Weff that is higher to that of the nanowire channel structure 140 on a significantly shorter channel structure and significantly lower parasitic parallel plate capacitance. Accordingly, the nanowire channel 304 provides a structure that is shorter, and thus much easier to fabricate than the nanowire channel structure 140. Furthermore, although the nanowire channel 304 and the nanowire channel structure 140 have similar SS, the nanowire channel 304 has a much lower parallel plate area, and thus lower parasitic parallel plate capacitance. This allows for the nanowire channel 304 to operate at higher frequencies.

As shown in the table 500 in FIG. 5, the nanowire channel 304 provides a higher (improved) effective channel width (Weff), lower (improved) SS (SS), and a shorter (improved) structure (Height) than the channel structure 112 of the FinFET 100 at a similar footprint (Width, Lateral Pitch, and Lgate). However, because of the separation areas, the nanowire channel 304 provides a slight increase in the parallel plate area, which may increase signal delay. Furthermore, the table 500 shows that the nanowire channel 304 provides a higher Weff, a significantly lower Height, and a significantly lower parallel plate area than the nanowire channel structure 140 of the nanowire device 132, while having the same footprint and without significantly increasing SS.

Figure 6A:
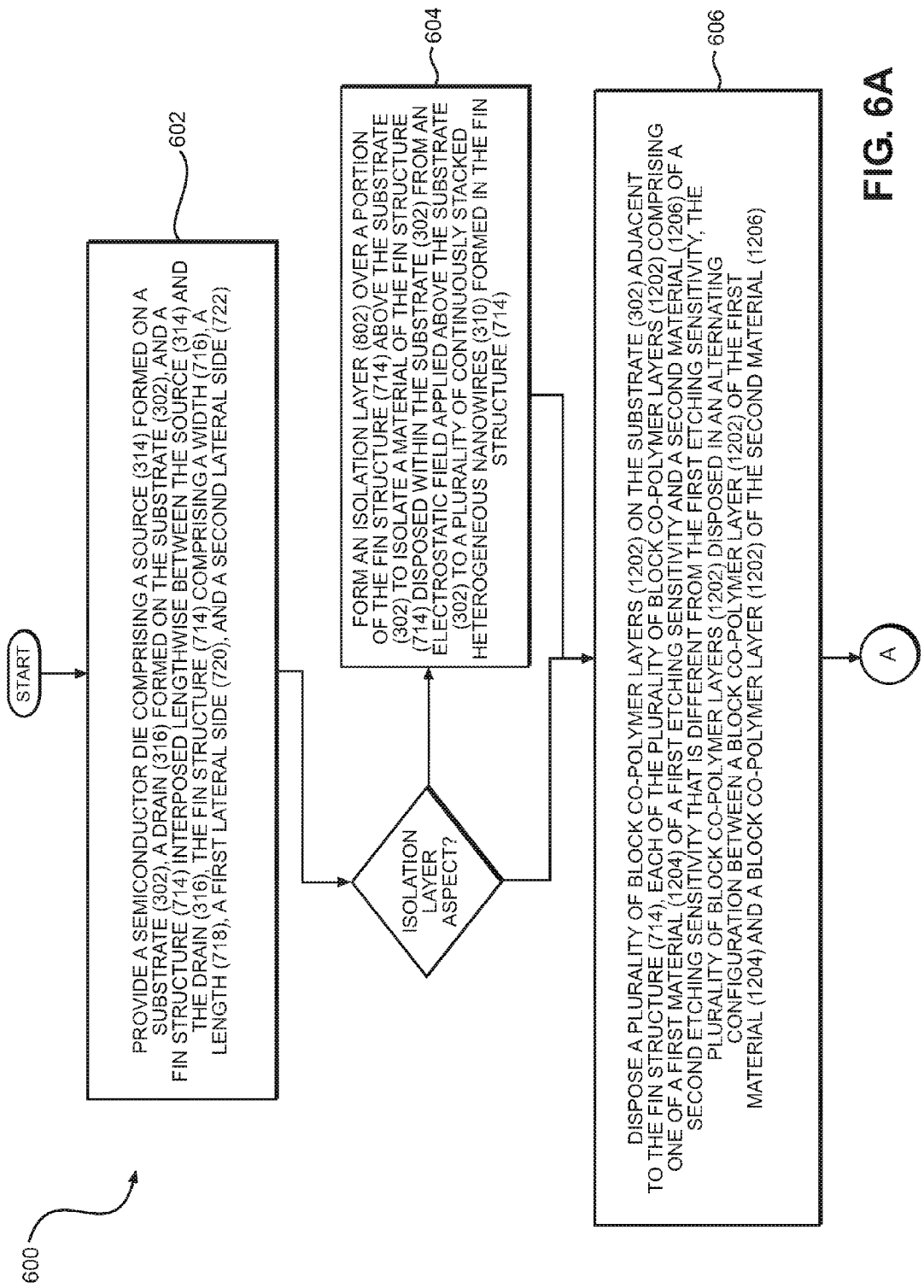
FIGS. 6A and 6B provide a flowchart illustrating an exemplary process for fabricating the exemplary nanowire device, including the exemplary nanowire channel structure, illustrated in FIGS. 3A and 3B.
Figure 6B:
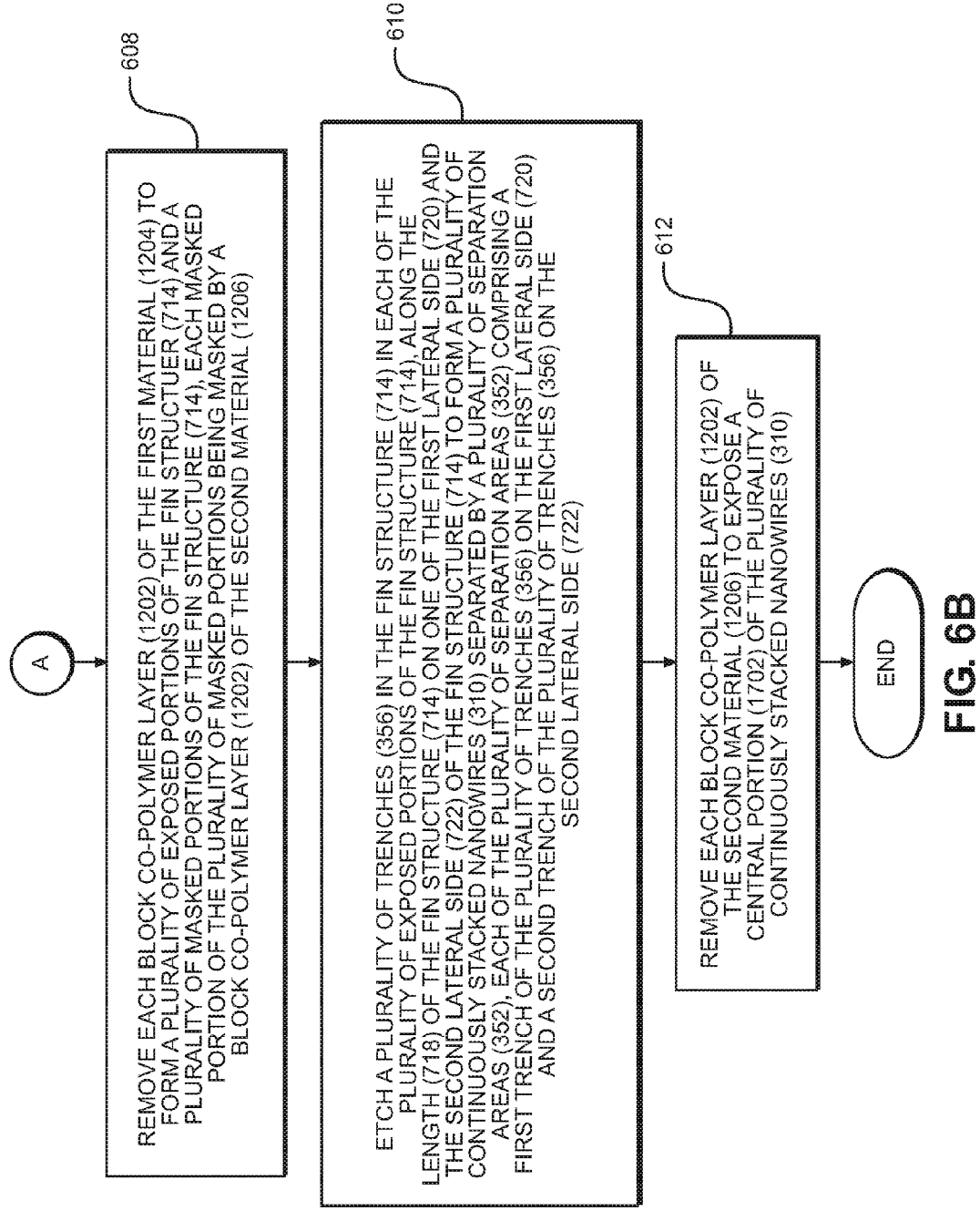

FIGS. 6A and 6B provide a flowchart illustrating an exemplary process 600 for fabricating the exemplary nanowire device 300, including the exemplary nanowire channel 304, illustrated in FIGS. 3A and 3B. The steps in the process 600 are illustrated respectively in FIGS. 7A-17B. FIGS. 7A-17B will be referenced as the exemplary steps in the process 600 in FIG. 6 are as described below.

A first exemplary step to fabricate the nanowire device 300 includes providing a semiconductor die comprising the source 314 formed on the substrate 302, the drain 316 formed on the substrate 302, and fin structure 714. The fin structure 714 is interposed lengthwise between the source 314 and the drain 316. The fin structure 714 comprises a width 716, a length 718, a first lateral side 720 and a second lateral side 722 (block 602 in FIG. 6A). FIGS. 7A and 7B illustrate a first stage 700 in the fabrication of the nanowire device 300 according to the first step in profile and cross section views, respectively. The first stage 700 illustrates channel material portions 702 and 703, formed using a self-aligned quadruple patterning process, for example. The channel material portions 702 and 703 are of a height 704 of 100 nm, for example. Accordingly, the channel material portions 702 and 703 are formed with increased tapering 706 near bottoms 708 and 709, respectively, due to fabrication limitations that prevent etching a minimally tapered semiconductor structure. The channel material portions 702 and 703 comprise, for example, Silicon (Si), Silicon Germanium (SiGe), or Germanium (Ge).

The first stage 700 further illustrates a shallow trench isolation substrate 302 disposed over the channel material portions 702 and 703 to provide isolation between the channel material portions 702 and 703 and between the nanowire device 300 and adjacent devices (not shown). The first stage 700 further illustrates that the substrate 302 is recessed down to expose the fin structures 714 and 715 from the channel material portions 702 and 703, respectively. The fin structures 714 and 715 are, for example, forty (40) nm in height and are minimally tapered. Accordingly, the first stage 700 illustrates, in particular, the substrate 302 and the fin structures 714 and 715 exposed above the substrate 302.

In one aspect, a next step to fabricate the nanowire device 300 may include forming an isolation layer 802 over a portion of the fin structure 714 above the substrate 302 to isolate a material of the fin structure 714 disposed within the substrate 302 from an electrostatic field applied above the substrate 302 to a plurality of continuously stacked nanowires 310(1-M) formed in the fin structure 714 (block 604 in FIG. 6A). FIGS. 8A and 8B illustrate a second stage 800 in the fabrication of the nanowire device 300 according to this step in profile and cross section views, respectively. This step can be performed, for example, by implanting oxygen at a lower portion 804 of the fin structure 714 above the substrate 302 to oxidize the lower portion 804 of the fin structure 714.

In particular, FIGS. 8A and 8B show the isolation layer 802 formed over the lower portions 804, 805 of fin structures 714 and 715, respectively, above the substrate 302. As will be described with further detail below, the fin structures 714 and 715 will be processed in later steps to form the continuously stacked nanowires 310(1-M) illustrated in FIGS. 3A and 3B. Furthermore, the gate material 320 will be disposed over the continuously stacked nanowires 310(1-M) and the substrate 302 in a later step, as illustrated in FIG. 3A, to provide the gate 318. Having the gate material 320 disposed over the continuously stacked nanowires 310(1-M) and the substrate 302 in this manner can result in an undesired parasitic channel in bottom sections 710, 711 of the channel material portions 702, 703. In this regard, the isolation layer 802 can be provided to isolate the bottom sections 710, 711 within the substrate 302 from an electrostatic field (not shown) provided by the gate 318. The isolation provided by the isolation layer 802 thus minimizes undesired parasitic channel in the bottom sections 710, 711 within the substrate 302. It is noted that the isolation layer 802 can be desirable in low power applications to minimize power loss to a parasitic channel within the substrate 302. In high performance applications, however, such a parasitic channel may increase drive current, thus improving performance. For purposes of the next steps for fabricating the nanowire device 300, however, the isolation layer 802 will not be illustrated as to not obscure other exemplary aspects.

Nevertheless, it is noted that the next steps may be performed when the isolation layer 802 is formed in the lower portions 804, 805 of the fin structures 714 and 715, respectively.

FIGS. 9A and 9B illustrate a third stage 900 in the fabrication of the nanowire device 300 according to the first step of the process 600 in profile and cross section views, respectively. The third stage 900 of the first step includes disposing a dielectric material layer 902 above the fin structures 714 and 715, and a poly mask/dummy gate 904 above the substrate 302 and above the fin structures 714 and 715. The dielectric material layer 902 is disposed because the material of the poly mask/dummy gate 904 may be comparable to the material 328 of the fin structures 714 and 715, and thus, isolation is needed for later etching of the poly mask/dummy gate 904 without removing the material 328 from the fin structures 714 and 715. The poly mask/dummy gate 904 is disposed above the substrate 302 and above the fin structures 714 and 715 for later formation of the spacer layers 322 and 323, the source 314, and the drain 316.

FIGS. 10A and 10B illustrate a fourth stage 1000 in the fabrication of the nanowire device 300 according to the first step of the process 600 in profile and cross section views, respectively. The fourth stage 1000 illustrates the spacer layers 322 and 323 disposed on the substrate 302 adjacent to the poly mask/dummy gate 904, and the source 314 and the drain 316 disposed on the substrate 302 adjacent to the spacer layers 322 and 323, respectively. The spacer layers 322 and 323 include a dielectric material. The source 314 and the drain 316 can be disposed by growing conductive material over the fin structures 714 and 715 using vapor-phase epitaxy, for example. The source 314 and the drain 316 can also be formed by disposing a conductive material over the fin structures 714 and 715, for example.

Figures 11A, 11B:
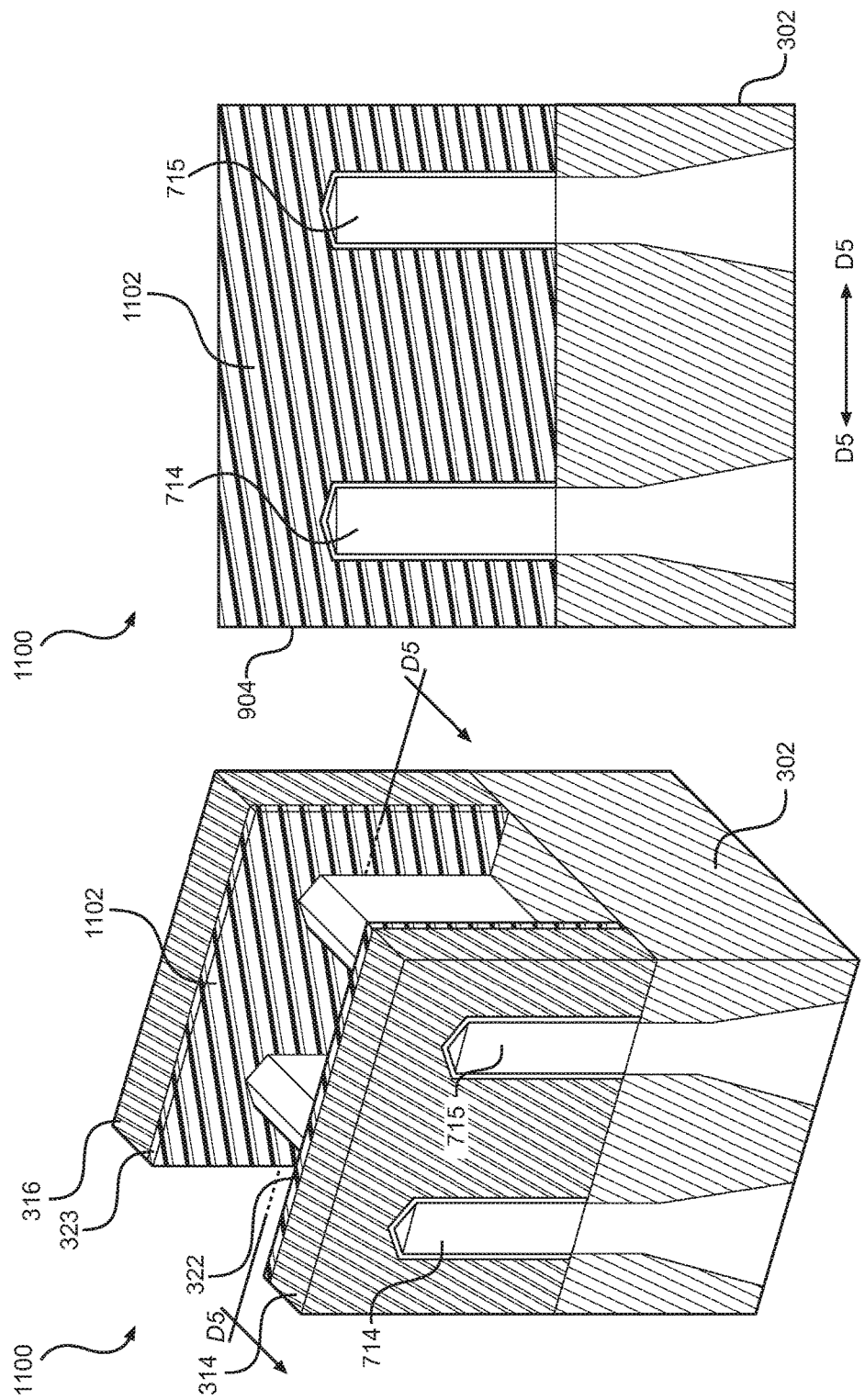
FIGS. 11A and 11B are profile and cross-sectional diagrams, respectively, of an exemplary fabrication process of removing the poly mask/dummy gate and exposing the fins for fabricating the exemplary nanowire device illustrated in FIGS. 3A and 3B.

FIGS. 11A and 11B illustrate a fifth stage 1100 in the fabrication of the nanowire device 300 according to the first step of the process 600 in profile and cross section views, respectively. After forming the spacer layers 322 and 323, the source 314, and the drain 316, the fifth stage 1100 of the first step includes removing the poly mask/dummy gate 904 and exposing the fin structures 714 and 715 in a gate area 1102 between the spacer layers 322 and 323. Accordingly, the fin structures 714 and 715 have been formed on the substrate 302 interposed lengthwise between the source 314 and the drain 316.

With continuing reference to FIG. 6A, a second step to fabricate the nanowire device 300 is disposing a plurality of block co-polymer layers 1202 on the substrate 302 adjacent to the fin structure 714, each block co-polymer layer 1202 comprising one of a first material 1204 of a first etching sensitivity and a second material 1206 of a second etching sensitivity that is different from the first etching sensitivity. The plurality of block co-polymer layers 1202 are disposed in an alternating configuration between a block co-polymer layer 1202 of the first material 1204 and a block co-polymer layer 1202 of the second material 1206 (block 606 in FIG. 6A).

Figures 12A, 12B:
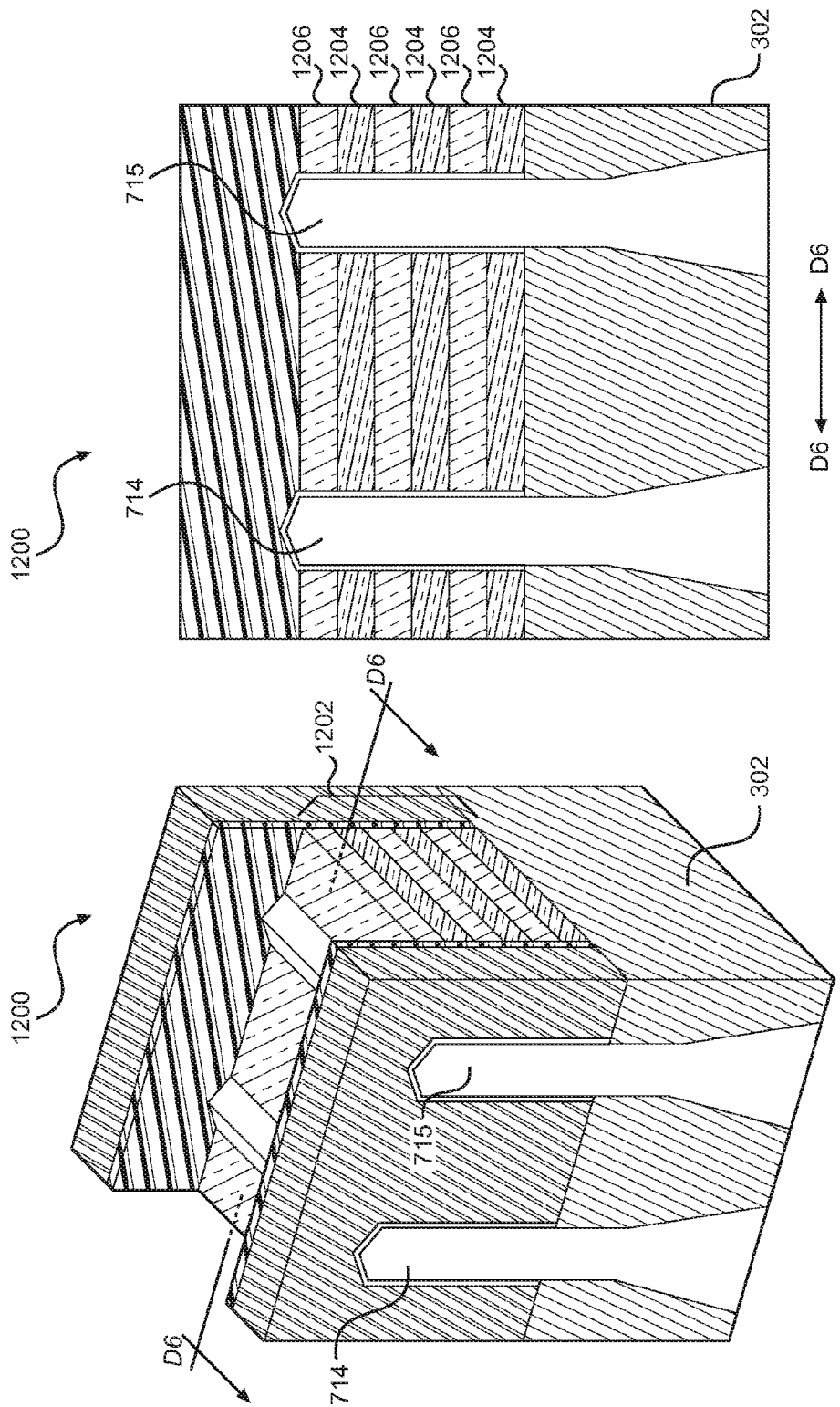
FIGS. 12A and 12B are profile and cross-sectional diagrams, respectively, of an exemplary fabrication process of disposing a plurality of block co-polymer layers above the fins in an alternating configuration between a block co-polymer layer of a first material and a block co-polymer layer of a second material for fabricating the exemplary nanowire device illustrated in FIGS. 3A and 3B.

FIGS. 12A and 12B illustrate a sixth stage 1200 in the fabrication of the nanowire device 300 according to the second step of the process 600. In particular, FIGS. 12A and 12B illustrate a plurality of block co-polymer layers 1202 disposed above the fin structures 714 and 715 in an alternating configuration between a block co-polymer layer 1202 of the first material 1204 and a block co-polymer layer 1202 of the second material 1206. In one aspect, the first material 1204 and the second material 1206 are self-organizing, such that the plurality of block co-polymer layers 1202 provides a deterministic way to etch the material 328, Silicon (Si) for example, out of the fin structures 714 and 715 to form the continuously stacked nanowires 310 (1-M), illustrated in FIG. 3B, in a later step.

A third step in the fabrication of the nanowire device 300 is disposing a capping layer 1302 above the plurality of block co-polymer layers 1202. FIGS. 13A and 13B illustrate a seventh stage 1300 in the fabrication of the nanowire device 300 according to this third step in profile and cross section views, respectively. In particular, FIGS. 13A and 13B illustrate the capping layer 1302 above the plurality of block co-polymer layers 1202. This step of disposing the capping layer 1302 is performed to allow removal of the plurality of block co-polymer layers 1202 from the area between the fin structures 714 and 715 in a later step. This step of disposing the capping layer 1302 is also performed to allow etching the material 328 out of the fin structures 714 and 715 from the area between the fin structures 714 and 715 and forming the separation areas 352 of the continuously stacked nanowires 310(1-M), illustrated in FIG. 3B, in a later step.

Figures 14A, 14B:
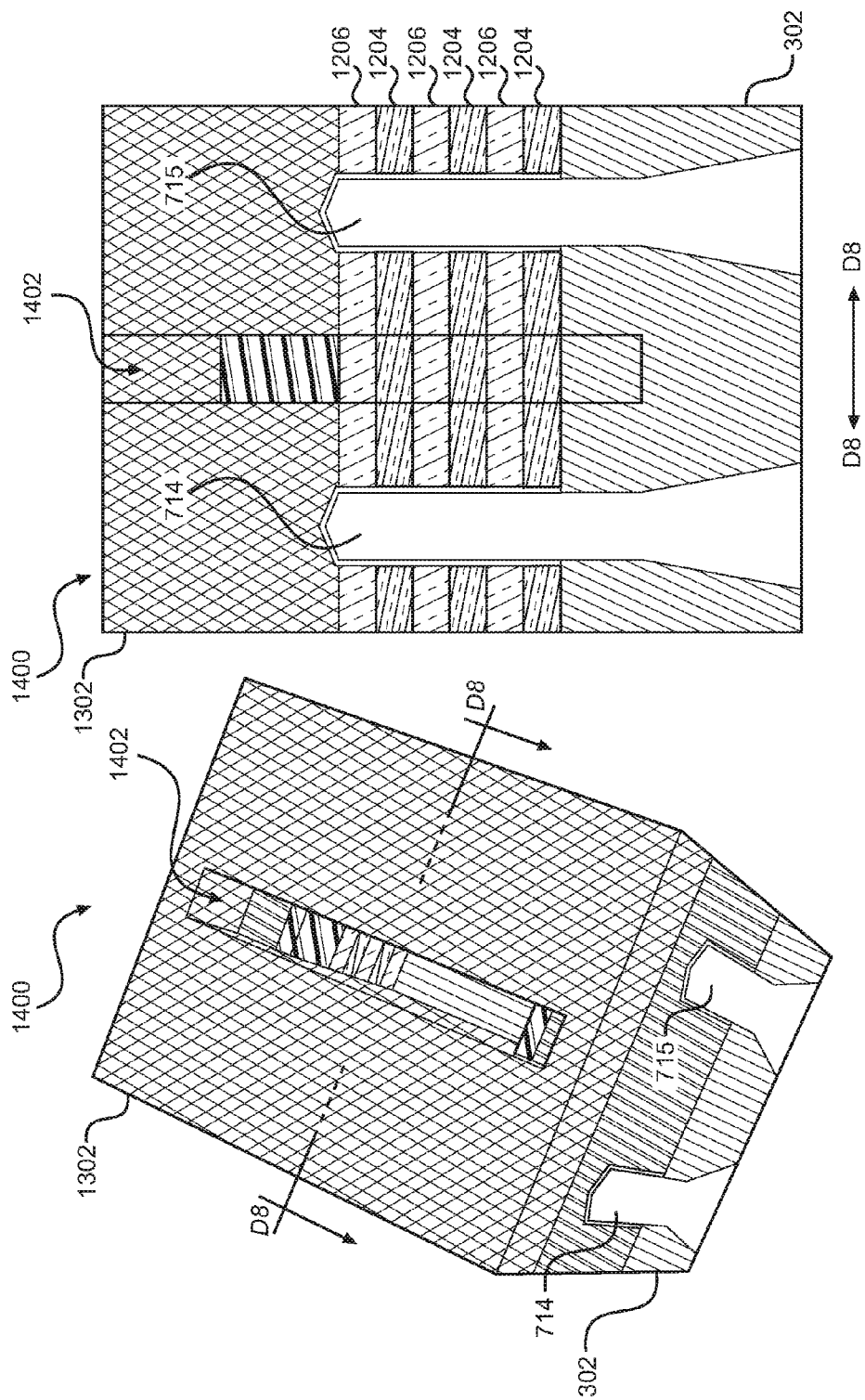
FIGS. 14A and 14B are profile and cross-sectional diagrams, respectively, of an exemplary fabrication process of removing a portion of the capping layer and a portion of each of the plurality of block co-polymer layers from an area between the fins down to the substrate for fabricating the exemplary nanowire device illustrated in FIGS. 3A and 3B.

A fourth step to fabricate the nanowire device 300 is removing a portion of the capping layer 1302 and a portion of each of the plurality of block co-polymer layers 1202 between the fin structures 714 and 7715 down to the substrate 302. FIGS. 14A and 14B illustrate an eighth stage 1400 in the fabrication of the nanowire device 300 according to this fourth step in profile and cross section views, respectively. In particular, FIGS. 14A and 14B illustrate an opening 1402 on the capping layer 1302 down to the substrate 302 corresponding to a removed portion of the capping layer 1302. This fourth step is performed by etching, for example, and to allow etching of the material 328 out of the fin structures 714 and 715 from the area between the fin structures 714 and 715, and to form the separation areas 352 of the continuously stacked nanowires 310(1-M), illustrated in FIG. 3B, in a later step.

Figures 15A, 15B:
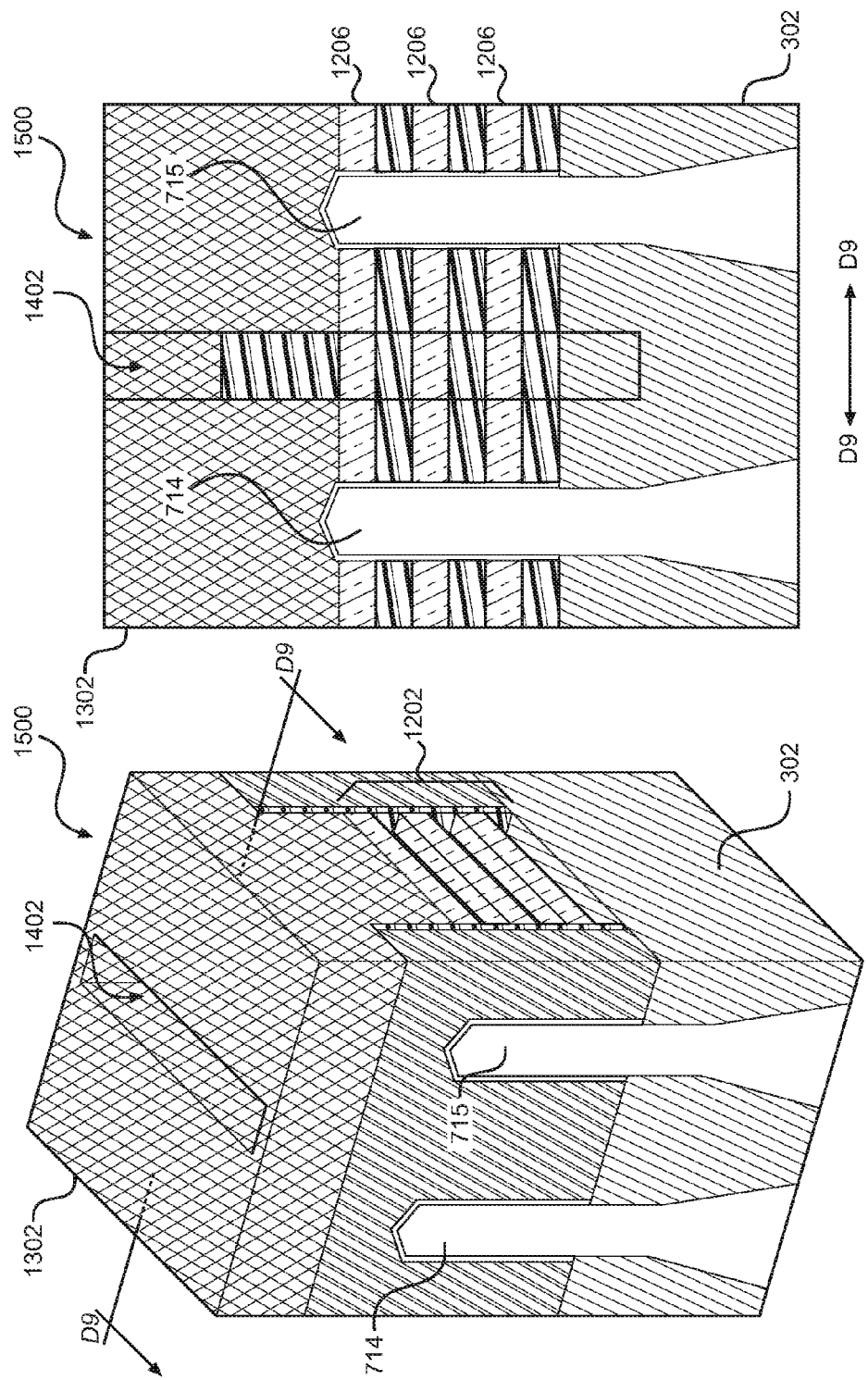
FIGS. 15A and 15B are profile and cross-sectional diagrams, respectively, of an exemplary fabrication process of removing each block co-polymer layer of the first material to form a plurality of exposed portions of the fins and a plurality of masked portions of the fins for fabricating the exemplary nanowire device illustrated in FIGS. 3A and 3B.

With reference to FIG. 6B, a fifth step to fabricate the nanowire device 300 is removing each block co-polymer layer 1202 of the first material 1204 to form a plurality of exposed portions of the fin structure 714 and a plurality of masked portions of the fin structure 714, each masked portion of the plurality of masked portions being masked by a block co-polymer layer 1202 of the second material 1206 (block 608 of FIG. 6B). FIGS. 15A and 15B illustrate a ninth stage 1500 in the fabrication of the nanowire device 300 according to this fifth step in profile and cross section views, respectively. In particular, FIGS. 15A and 15B illustrate the absence of each block co-polymer layer 1202 of the first material 1204 from the plurality of block co-polymer layers 1202, leaving only each block co-polymer layer 1202 of the second material 1206. This fifth step is performed to allow etching of the material 328 out of the fin structures 714 and 715 and to form the separation areas 352 of the continuously stacked nanowires 310(1-M), illustrated in FIG. 3B, in a later step. The block co-polymer layers 1202 of the second material 1206 protect sections of the fin structures 714 and 715 from the etching forming the separation areas 352 in a later step (not shown), the protected sections becoming the central portions of the continuously stacked nanowires 310 (1-M), illustrated in FIG. 3B.

Figures 16A, 16B:
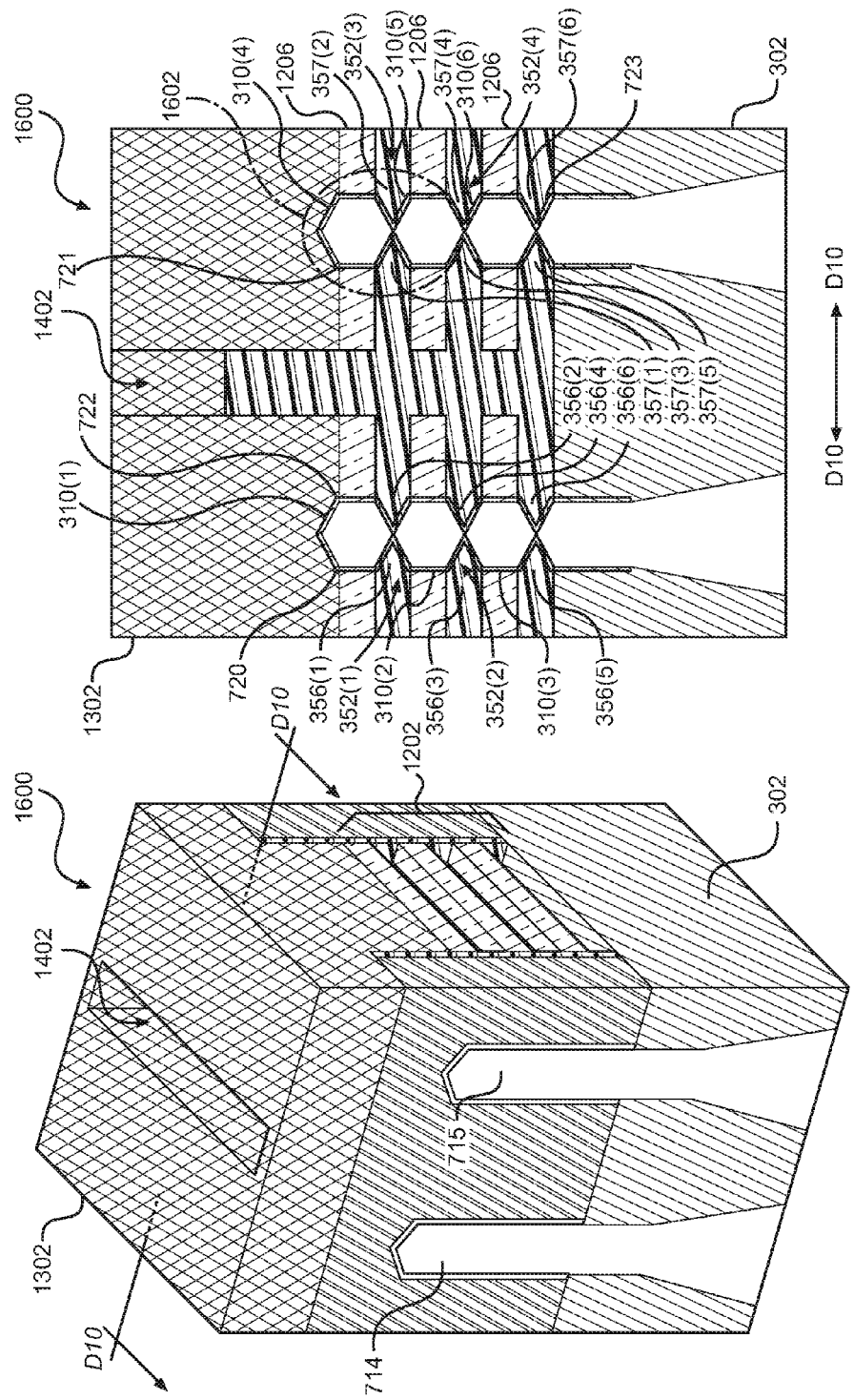
FIGS. 16A-16C are profile and cross-sectional diagrams, respectively, of an exemplary fabrication process of etching a trench in each of the plurality of exposed portions of the fins, to form separation areas between vertically adjacent nanowires for fabricating the exemplary nanowire device illustrated in FIGS. 3A and 3B.

With continuing reference to FIG. 6B, a sixth step to fabricate the nanowire device 300 is etching a plurality of trenches 356(1-6) in the fin structure 714 in each of the plurality of exposed portions of the fin structure 714, along the length 718 of the fin structure 714 on one of the first lateral side 720 and the second lateral side 722 of the fin structure 714 to form a plurality of continuously stacked nanowires 310(1-M) separated by a plurality of separation areas 352(1) and 352(2), each of the plurality of separation areas 352(1) and 352(2) comprising a first trench of the plurality of trenches 356(1-6) on the first lateral side 720 and a second trench of the plurality of trenches 356(1-6) on the second lateral side 722 (block 610 of FIG. 6B). FIGS. 16A and 16B illustrate a tenth stage 1600 in the fabrication of the nanowire device 300 according to this sixth step in profile and cross section views, respectively. In particular, the tenth stage 1600 illustrates the plurality of trenches 356(1-6) in the fin structure 714 and a plurality of trenches 357 (1-6) in the fin structure 715. In the fin structure 714, the plurality of trenches 356(1-6) are etched on the first and second lateral sides 720 and 722, and in the fin structure 715, the plurality of trenches 357(1-6) are etched on the first and second lateral sides 721 and 723. The plurality of trenches 356(1-6) and 357(1-6) form a plurality of continuously stacked nanowires 310(1-6) separated by a plurality of separation areas 352(1-4), each of the plurality of separation areas 352(1-4) comprising first and second trenches of the plurality of trenches 356(1-6) and 357(1-6). The etching to create the plurality of trenches 356(1-6) and 357(1-6) can be performed as a time-based wet chemical etch, where the material 328 of the fin structures 714 and 715 is exposed to a wet chemical for a predetermined period of time according to a time necessary to etch the material 328 to a stop at a BCC <111> facet sidewall. In particular, when the material 328 is disposed or grown on a (100) surface orientation with a (110) sidewall orientation, exposing a portion of the material 328 to the chemical etch causes an etching stop on a BCC <111> facet sidewall. Thus, the chemical etch forms a triangular recess area, or a trench, as is illustrated in further detail in FIG. 16C below with respect to the fin structure 715 of the nanowire device 300.

Figure 16C:
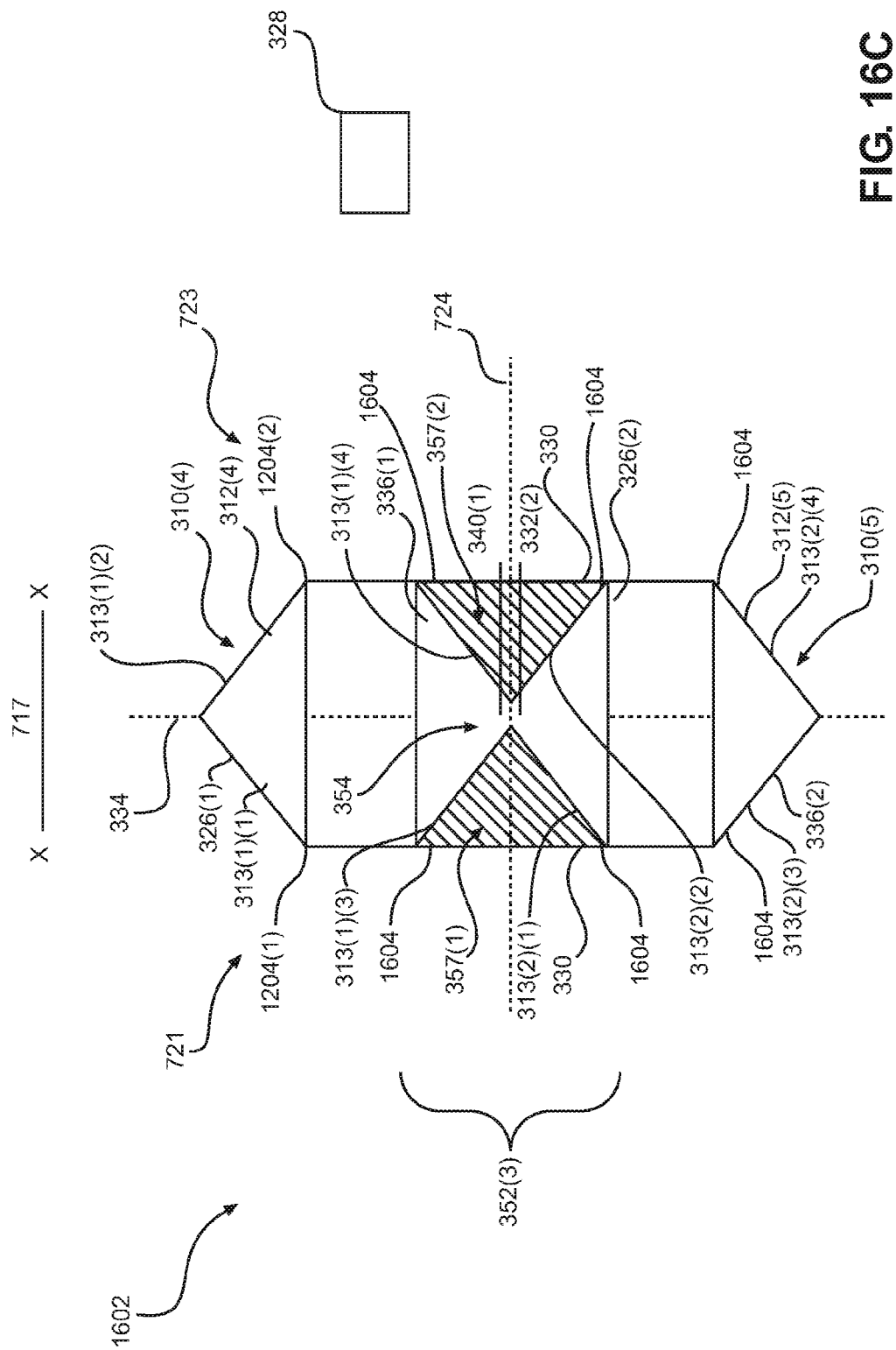

FIG. 16C illustrates an insert section 1602 to provide further detail of elements of the tenth stage 1600 illustrated in FIGS. 16A and 16B when using a time-based chemical etch. In particular, FIG. 16C illustrates a separation area 352(3) in detail. In FIG. 16C, the separation area 352(3) comprises a bottom end portion 336(1) of a higher vertically adjacent nanowire 310(4), and a top end portion 326(2) of a lower vertically adjacent nanowire 310(5). The separation area 352(3) further comprises a continuity area 354 having a contact of a bottom end point 340(1) of the higher vertically adjacent nanowire 310(4) and a top end point 332(2) of the lower vertically adjacent nanowire 310(5), and trenches 357(1) and 357(2) adjacent to the continuity area 354 on each of the first lateral side 721 and the second lateral side 723 and between the vertically adjacent nanowires 310(4), 310(5). The trenches 357(1) and 357(2) of the plurality of trenches 357(1-6) have a substantially triangular cross section 330 with BCC <111> facet sidewalls 313(1) (3), 313(1)(4), 313(2)(1), and 313(2)(2). In particular, the trenches 357(1) and 357(2) have a depth that is substantially half the width 717 of the fin structure 715, at a vertical center 724 of the layer of the material 328 corresponding to the trenches 357(1) and 357(2), substantially zero at an edge 1604(0)-1604(8) of the corresponding trenches 357(1) and 357(2), and substantially linearly variable between the vertical center 335 of the layer of the material 328 corresponding to the trenches 357(1) and 357(2) and the edge 1604 (0)-1604(8) of the corresponding trenches 357(1) and 357 (2), to form the nanowires 310(4) and 310(5) separated by a separation areas 352(3). It is noted that the edges 1604

(0)-1604(8) result from the masking of the central portions of the fin structure 715 by the block co-polymer layers 1202 of the second material 1206.

As illustrated in FIG. 16C, each of the vertically adjacent nanowires 310(4) and 310(5) has a corresponding cross section 312(4) and 312(5), which in this example is a substantially hexagonal-shaped cross section formed, in part, by the BCC <111> facet sidewalls 313(1)(1)-313(1)(4) and 313(2)(1)-313(2)(4), respectively. Furthermore, the vertically adjacent nanowires 310(4) and 310(5) are interconnected at the continuity area 354. This continuously stacked arrangement allows the gate material 320 to be disposed within the trenches 357(1) and 357(2) between the vertically adjacent nanowires 310(4) and 310(5). With regards to the nanowire device 300 as a whole, having the plurality of nanowires 310(1)-310(6) in the continuously stacked arrangement described above provides improved gate control compared to a fin channel structure of similar height and width, and gate control similar to that of a much taller conventional nanowire channel structure. Furthermore, this continuously stacked arrangement provides for a significantly lower parasitic channel capacitance between the vertically adjacent nanowires of the plurality of nanowires 310(1)-310(6) in the nanowire channel 304 compared to the nanowire channel structure 140 illustrated in FIG. 2B. Furthermore, this continuously stacked arrangement obviates the need for a vertical separation distance 162 employed in the nanowire channel structure 140, as illustrated in FIG. 2B, which allows for shorter nanowire channel structures 306, 308 and for including a higher number of nanowires compared to the nanowire channel structure 140 illustrated in FIG. 2B. The shorter nanowire channel structures 306, 308 further provide for a lower parallel plate parasitic capacitance compared to the nanowire channel structure 140 illustrated in FIG. 2B.

With continuing reference to FIG. 6B, a seventh step to fabricate the nanowire device 300 is removing each block co-polymer layer 1202 of the second material 1206 to expose a central portion 1702 of the plurality of continuously stacked nanowires 310(1-M) (block 612 of FIG. 6B). The capping layer 1302 is also removed. FIGS. 17A and 17B illustrate an eleventh stage 1700 in the fabrication of the nanowire device 300 according to this next step in profile and cross section views, respectively. In particular, FIGS. 17A and 17B illustrate a plurality of exposed central portions 1702(1-6) of the plurality of the continuously stacked nanowires 310(1-3) in the fin structure 714. Furthermore, FIGS. 17A and 17B illustrate a plurality of exposed central portions 1704(1-6) of the plurality of the continuously stacked nanowires 310(4-6) in the fin structure 715.

Example Environment

Figure 18:
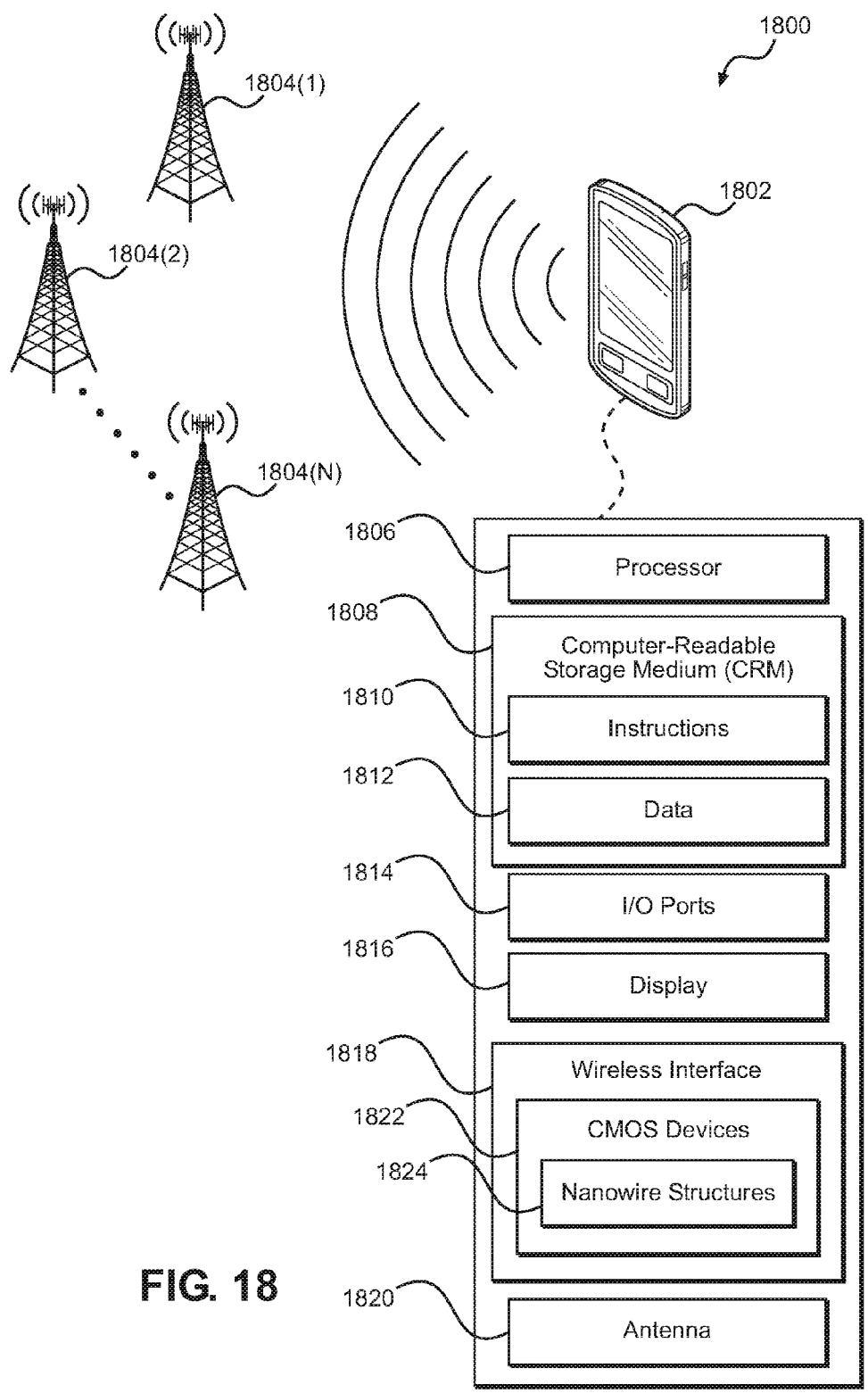
FIG. 18 illustrates an example environment that includes a computing device and wireless network in which the exemplary nanowire device illustrated in FIGS. 3A and 3B may be employed.

FIG. 18 illustrates an example environment 1800 that includes a computing device 1802 and wireless network (not shown) in which the exemplary nanowire device 300 illustrated in FIGS. 3A and 3B may be employed. In this example, the computing device 1802 is implemented as a smart-phone. Although not shown, the computing device 1802 may be implemented as any suitable computing or electronic device, such as a modem, cellular base station, broadband router, access point, cellular phone, gaming device, navigation device, media device, laptop computer, cellular test equipment, desktop computer, server, network-attached storage (NAS) device, smart appliance, vehicle-based communication system, and the like. The computing device 1802 communicates data via cell towers 1804(1)-1804(N), which may be configured to provide a wireless network. Although shown as three (3) cell towers, cell towers 1804(1)-1804(N) may represent any suitable number of cell towers 1804, where n equals any suitable integer.

The computing device 1802 includes a processor 1806 and a computer-readable storage medium (CRM) 1808. The processor 1806 may include any type of processor, such as an application processor or multi-core processor, configured to execute processor-executable code stored by the CRM 1808. The CRM 1808 may include any suitable type of data storage media, such as volatile memory (e.g., random access memory (RAM)), non-volatile memory (e.g., Flash memory), optical media, magnetic media (e.g., disk or tape), and the like. In the context of this disclosure, the CRM 1808 is implemented to store instructions 1810 and data 1812 of the computing device 1802, and thus does not include transitory propagating signals or carrier waves.

The computing device 1802 also includes input/output (I/O) ports 1814, a display 1816, and a wireless interface 1818. The I/O ports 1814 enable data exchanges or interaction with other devices, networks, or users. The I/O ports 1814 may include serial ports (e.g., universal serial bus (USB) ports), parallel ports, audio ports, infrared (IR) ports, and the like. The display 1816 presents graphics of the computing device 1802, such as a user interface associated with an operating system, program, or application.

The wireless interface 1818 provides connectivity to respective networks and other electronic devices, such as by communicating signals via an antenna 1820. Alternately or additionally, the computing device 1802 may include a wired data interface, such as Ethernet or fiber optic interfaces for communicating over a local network, intranet, or the Internet. To facilitate the communication of signals via these combinations of modes, carriers, and frequencies, the wireless interface 1818 may include a variety of components, such as processors, memories, digital signal processors (DSPs), analog and RF circuits, and the like.

In some aspects, components of the wireless interface 1818 and other components of the computing device 1802 are implemented with CMOS devices 1822, such as the continuously stacked nanowires 310 for the nanowire device illustrated in FIGS. 3A and 3B. The CMOS devices 1822 may be formed or configured with any suitable technology and include nanowire structures 1824 such as the nanowire channel 304 illustrated in FIGS. 3A and 3B, the implementations and use of which varies and is described above.

The nanowire channel structures of continuously stacked nanowires for CMOS devices according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 19:
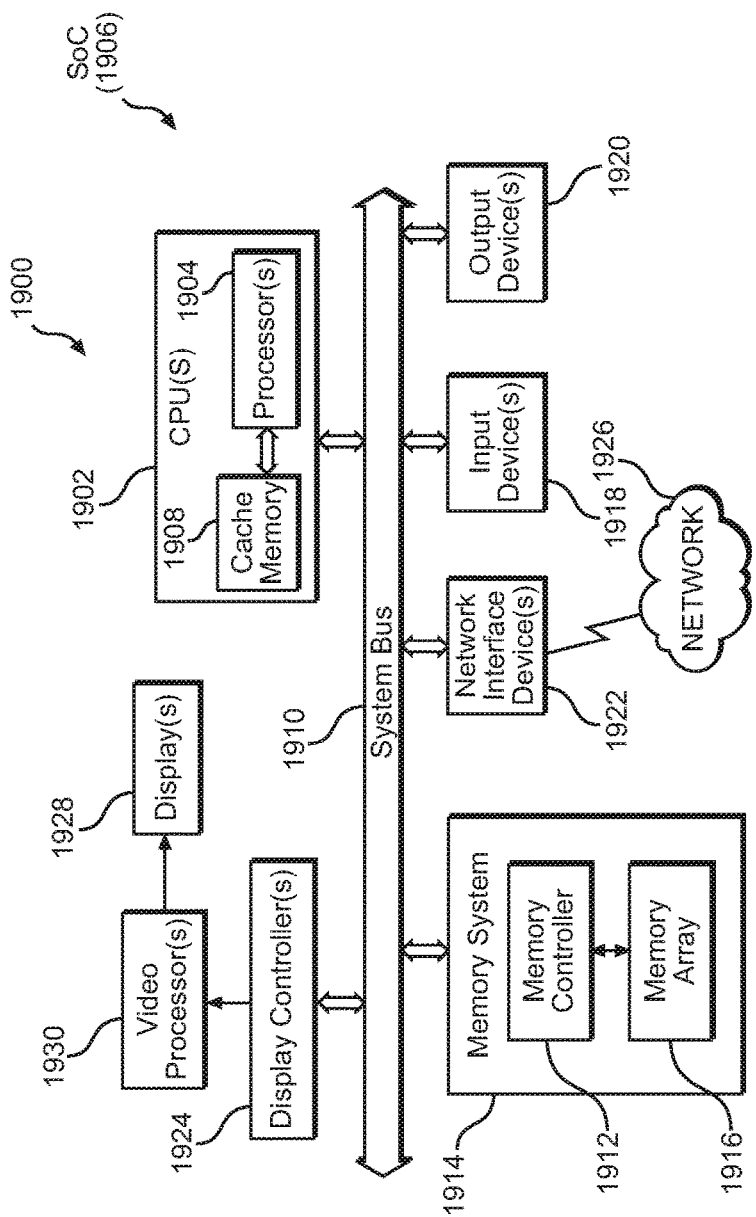
FIG. 19 is a block diagram of an exemplary processor-based system that can include the exemplary nanowire device illustrated in FIGS. 3A and 3B.

In this regard, FIG. 19 is a block diagram of an exemplary processor-based system 1900 that can include the exemplary nanowire device 300 illustrated in FIGS. 3A and 3B. In this example, the processor-based system 1900 includes one or more CPUs 1902, each including one or more processors 1904. The processor-based system 1900 may be provided as a system-on-a-chip (SoC) 1906. The CPU(s) 1902 may have cache memory 1908 coupled to the processor(s) 1904 for rapid access to temporarily stored data. The CPU(s) 1902 is coupled to a system bus 1910 and can intercouple master and slave devices included in the processor-based system 1900. As is well known, the CPU(s) 1902 communicates with these other devices by exchanging address, control, and data information over the system bus 1910. For example, the CPU(s) 1902 can communicate bus transaction requests to a memory controller 1912 in a memory system 1914 as an example of a slave device. Although not illustrated in FIG. 19, multiple system buses 1910 could be provided, wherein each system bus 1910 constitutes a different fabric. In this example, the memory controller 1912 is configured to provide memory access requests to a memory array 1916 in the memory system 1914.

Other devices can be connected to the system bus 1910. As illustrated in FIG. 19, these devices can include the memory system 1914, one or more input devices 1918, one or more output devices 1920, one or more network interface devices 1922, and one or more display controllers 1924, as examples. The input device(s) 1918 can include any type of input device, including but not limited to input keys, switches, voice processors, etc. The output device(s) 1920 can include any type of output device, including but not limited to audio, video, other visual indicators, etc. The network interface device(s) 1922 can be any devices configured to allow exchange of data to and from a network 1926. The network 1926 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1922 can be configured to support any type of communications protocol desired.

The CPU(s) 1902 may also be configured to access the display controller(s) 1924 over the system bus 1910 to control information sent to one or more displays 1928. The display controller(s) 1924 sends information to the display(s) 1928 to be displayed via one or more video processors 1930, which process the information to be displayed into a format suitable for the display(s) 1928. The display(s) 1928 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A semiconductor device, comprising:
 a substrate;
 a source disposed above the substrate;
 a drain disposed above the substrate; and
 a channel body interposed between the source and the drain, the channel body comprising:

a channel comprising a nanowire channel structure
comprising:
a plurality of nanowires arranged in a continuously
stacked arrangement, each of the plurality of
nanowires comprising:
a top end portion;
a bottom end portion; and
a central portion disposed between the top end
portion and the bottom end portion, the central
portion comprising a greater width than the top
end portion and the bottom end portion;
a plurality of separation areas, each disposed
between central portions of vertically adjacent
nanowires among the plurality of nanowires, and
each formed by the bottom end portion of a higher
nanowire of the vertically adjacent nanowires and
the top end portion of a lower nanowire of the
vertically adjacent nanowires; and
an isolation layer formed between the substrate and
a nanowire among the plurality of nanowires
located adjacent to the substrate;
a dielectric material layer disposed adjacent to the
plurality of nanowires and extending into the plurality of separation areas disposed between the central
portions of the vertically adjacent nanowires among
the plurality of nanowires; and
a gate material disposed adjacent to the dielectric
material layer and extending into the plurality of
separation areas disposed between the central portions of the vertically adjacent nanowires among the
plurality of nanowires;
wherein:
the central portion, the top end portion, and the
bottom end portion of each of the plurality of
nanowires comprise body-centered cubic (BCC)
facet sidewalls; and
the BCC facet sidewalls of the central portion of
each of the plurality of nanowires comprise BCC
<110> facet sidewalls, and wherein the BCC facet
sidewalls of the top end portion and the bottom
end portion of each of the plurality of nanowires
comprise BCC <111> facet sidewalls.

2. The semiconductor device of claim 1, wherein the
body-centered cubic (BCC) facet sidewalls of each of the
plurality of nanowires form a substantially hexagonal cross
section.

3. The semiconductor device of claim 1, wherein the
plurality of nanowires comprise one of Silicon Germanium
(SiGe), Silicon (Si), or Germanium (Ge).

4. The semiconductor device of claim 1, wherein the
isolation layer is configured to isolate a channel material
within the substrate from an electrostatic field applied to the
channel.

5. The semiconductor device of claim 1, wherein the gate
material does not completely surround at least one nanowire
among the plurality of nanowires.

6. The semiconductor device of claim 1, wherein the gate
material does not completely surround any nanowire among
the plurality of nanowires.

7. The semiconductor device of claim 1, wherein the
channel further comprises:
a second nanowire channel structure comprising a second
plurality of nanowires arranged in a continuously
stacked arrangement, each of the second plurality of
nanowires comprising:
a top end portion;
a bottom end portion; and
a central portion disposed between the top end portion
and the bottom end portion, the central portion
comprising a greater width than the top end portion
and the bottom end portion; and
a second plurality of separation areas, each disposed
between central portions of vertically adjacent
nanowires among the second plurality of nanowires,
and each formed by the bottom end portion of a higher
nanowire of the vertically adjacent nanowires and the
top end portion of a lower nanowire of the vertically
adjacent nanowires;
the channel body further comprising a second dielectric
material layer disposed adjacent to the second plurality
of nanowires and extending into the second plurality of
separation areas disposed between the central portions
of the vertically adjacent nanowires among the second
plurality of nanowires; and
the gate material further disposed adjacent to the second
dielectric material layer and extending into the second
plurality of separation areas disposed between the
central portions of the vertically adjacent nanowires
among the second plurality of nanowires.

8. The semiconductor device of claim 1 integrated into a
semiconductor die.

9. The semiconductor device of claim 1 integrated into a
device selected from the group consisting of: a set top box;
an entertainment unit; a navigation device; a communications device; a fixed location data unit; a mobile location
data unit; a mobile phone; a cellular phone; a smart phone;
a tablet; a phablet; a server; a computer; a portable computer; a desktop computer; a personal digital assistant
(PDA); a monitor; a computer monitor; a television; a tuner;
a radio; a satellite radio; a music player; a digital music
player; a portable music player; a digital video player; a
video player; a digital video disc (DVD) player; a portable
digital video player; and an automobile.

10. A method of fabricating a semiconductor device,
comprising:
providing a semiconductor die for a semiconductor device
comprising:
a source formed above a substrate;
a drain formed above the substrate; and
a fin structure comprising a width and a length, the fin
structure interposed lengthwise between the source
and the drain, and comprising a first lateral side and
a second lateral side;
disposing a plurality of block co-polymer layers on the
substrate adjacent to the fin structure, each of the
plurality of block co-polymer layers comprising one of
a first material of a first etching sensitivity and a second
material of a second etching sensitivity different from
the first etching sensitivity, the plurality of block co-polymer layers disposed in an alternating configuration
between a block co-polymer layer of the first material
and a block co-polymer layer of the second material;
removing each block co-polymer layer of the first material
to form a plurality of exposed portions of the fin
structure and a plurality of masked portions of the fin
structure, each masked portion of the plurality of
masked portions being masked by a block co-polymer
layer of the second material;
etching a plurality of trenches in the fin structure in each
of the plurality of exposed portions of the fin structure,
along the length of the fin structure on one of the first
lateral side and the second lateral side of the fin
structure to form a plurality of continuously stacked nanowires separated by a plurality of separation areas, each of the plurality of separation areas comprising:
  a first trench of the plurality of trenches on the first lateral side; and
  a second trench of the plurality of trenches on the second lateral side; and
removing each block co-polymer layer of the second material to expose a central portion of the plurality of continuously stacked nanowires.

11. The method of claim 10, wherein disposing the plurality of block co-polymer layers on the substrate adjacent to the fin structure comprises disposing self-organizing material comprising the first material and the second material.

12. The method of claim 10, further comprising disposing a capping layer above the plurality of block co-polymer layers before removing each block co-polymer layer of the first material.

13. The method of claim 10, further comprising disposing a dielectric material layer adjacent to the plurality of continuously stacked nanowires and extending into each of the plurality of trenches forming the plurality of separation areas.

14. The method of claim 13, further comprising disposing a gate material adjacent to the dielectric material layer and extending into each of the plurality of trenches forming the plurality of separation areas.

15. The method of claim 10, wherein each block co-polymer layer of the second material forms the central portion of each of the plurality of continuously stacked nanowires comprising body-centered cubic (BCC) facet sidewalls; and
  wherein the first trench and the second trench of the plurality of separation areas form a top end portion and a bottom end portion comprising BCC facet sidewalls for corresponding nanowires of the plurality of continuously stacked nanowires to form a substantially hexagonal cross section for each of the plurality of continuously stacked nanowires.

16. The method of claim 15, wherein the BCC facet sidewalls of the central portion of each of the plurality of continuously stacked nanowires are formed as BCC <110> facet sidewalls, and wherein the BCC facet sidewalls of the top end portion and the bottom end portion of each of the plurality of continuously stacked nanowires are formed as BCC <111> facet sidewalls.

17. The method of claim 16, wherein etching the plurality of trenches in the fin structure along the length of the fin structure comprises exposing the fin structure to a wet chemical for a predetermined period of time.

18. The method of claim 17, wherein the predetermined period of time is determined based on a time required to etch the fin structure and stop on a BCC <111> facet sidewall to form the BCC facet sidewalls of the top end portion and the bottom end portion of each of the plurality of continuously stacked nanowires as BCC <111> facet sidewalls that converge to a horizontal center of the fin structure.

19. The method of claim 10, further comprising forming an isolation layer over a portion of the fin structure above the substrate to isolate a material of the fin structure disposed within the substrate from an electrostatic field applied above the substrate to the plurality of continuously stacked nanowires.

20. The method of claim 19, wherein forming the isolation layer comprises implanting oxygen at the portion of the fin structure above the substrate to oxidize the portion of the fin structure and form the isolation layer at the portion of the fin structure.

21. The method of claim 20, further comprising recessing the substrate before implanting the oxygen at a lower portion of the fin structure above the substrate.

22. The method of claim 21, wherein recessing the substrate comprises etching the substrate.

23. The method of claim 22, further comprising disposing a dielectric material layer adjacent to the plurality of continuously stacked nanowires and extending into each of the plurality of trenches forming the plurality of separation areas.

24. The method of claim 23, further comprising disposing a gate material adjacent to the dielectric material layer and extending into each of the plurality of trenches forming the plurality of separation areas.

25. A semiconductor device, comprising:
  a means for providing a substrate;
  a means for forming a source disposed above the substrate;
  a means for forming a drain disposed above the substrate; and
  a means for forming a channel body interposed between the means for forming the source and the means for forming the drain, the channel body comprising:
    a means for forming a channel comprising a nanowire channel structure comprising:
      a plurality of nanowires arranged in a continuously stacked arrangement, each of the plurality of nanowires comprising:
        a top end portion;
        a bottom end portion; and
        a central portion disposed between the top end portion and the bottom end portion, the central portion comprising a greater width than the top end portion and the bottom end portion; and
      a plurality of separation areas, each disposed between central portions of vertically adjacent nanowires among the plurality of nanowires, and each formed by the bottom end portion of a higher nanowire of the vertically adjacent nanowires and the top end portion of a lower nanowire of the vertically adjacent nanowires; and
    a means for forming a dielectric material layer disposed adjacent to the plurality of nanowires and extending into portions of the plurality of separation areas disposed between the central portions of the vertically adjacent nanowires among the plurality of nanowires; and
  a means for forming a gate material disposed adjacent to the means for forming the dielectric material layer and extending into the portions of the plurality of separation areas disposed between the central portions of the vertically adjacent nanowires among the plurality of nanowires;
  wherein:
    the central portion, the top end portion, and the bottom end portion of each of the plurality of nanowires comprise body-centered cubic (BCC) facet sidewalls; and
    the BCC facet sidewalls of the central portion of each of the plurality of nanowires comprise BCC <110> facet sidewalls, and wherein the BCC facet sidewalls of the top end portion and the bottom end portion of each of the plurality of nanowires comprise BCC <111> facet sidewalls.

26. The semiconductor device of claim 25, wherein the body-centered cubic (BCC) facet sidewalls of each of the plurality of nanowires form a substantially hexagonal cross section.

27. The semiconductor device of claim 25, wherein the means for forming the gate material does not completely surround at least one nanowire among the plurality of nanowires.

28. The semiconductor device of claim 25, wherein the means for forming the gate material does not completely surround any nanowire among the plurality of nanowires.

29. The semiconductor device of claim 25, wherein the means for forming the channel further comprises an isolation layer formed on the substrate over a portion of the nanowire channel structure, the isolation layer configured to isolate a channel material within the substrate from an electrostatic field applied to the means for forming the channel.

* * * * *